United States Patent
Robinett et al.

(10) Patent No.: US 8,121,807 B2
(45) Date of Patent: Feb. 21, 2012

(54) METHOD AND SYSTEM FOR DEVICE RECONFIGURATION FOR DEFECT AMELIORATION

(75) Inventors: Joseph Warren Robinett, Chapel Hill, NC (US); Philip J. Kuekes, Menlo Park, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 739 days.

(21) Appl. No.: 12/288,021

(22) Filed: Oct. 15, 2008

(65) Prior Publication Data

US 2010/0094580 A1    Apr. 15, 2010

(51) Int. Cl.
*G01R 27/28* (2006.01)
(52) U.S. Cl. ...................................................... 702/117
(58) Field of Classification Search ................. 702/117; 700/81; 365/200, 220
See application file for complete search history.

(56) References Cited

U.S. PATENT DOCUMENTS

| | | | |
|---|---|---|---|
| 2004/0008562 A1* | 1/2004 | Ito et al. | 365/223 |
| 2004/0246796 A1* | 12/2004 | Konuk et al. | 365/200 |
| 2010/0076575 A1* | 3/2010 | Vasko et al. | 700/81 |

* cited by examiner

*Primary Examiner* — Drew A Dunn
*Assistant Examiner* — Xiuquin Sun

(57) ABSTRACT

Embodiments of the present invention are directed to cost-effective defect amelioration in manufactured electronic devices that include nanoscale components. Certain embodiments of the present invention are directed to amelioration of defects in electronic devices that contain nanoscale demultiplexers. In certain embodiments of the present invention, the nanoscale-demultiplexer-containing devices include reconfigurable encoders. In one embodiment of the present invention, the table of codes within a reconfigurable encoder is permuted, and a device is configured in accordance with the permuted codes, in order to produce a permuted table of codes that, when input to an appropriately configured nanoscale demultiplexer, produces correct outputs despite defects in the nanoscale demultiplexer.

20 Claims, 18 Drawing Sheets

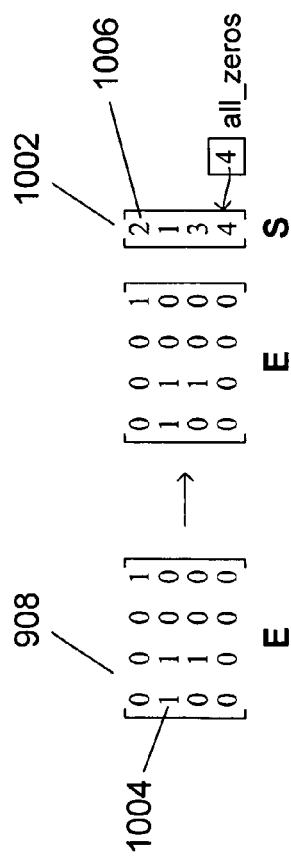
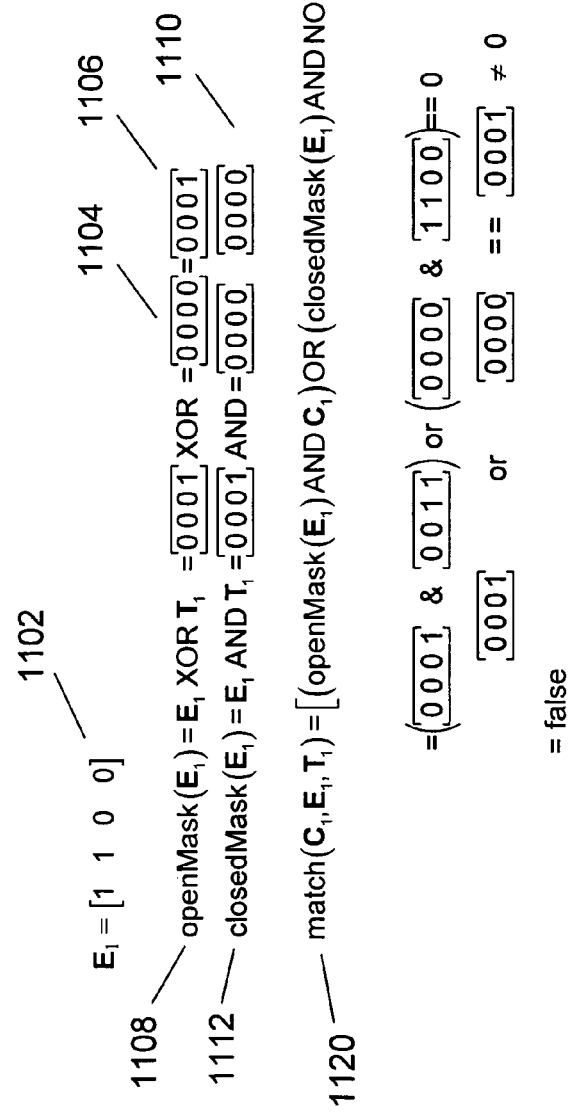
Figure 10
Figure 11

METHOD AND SYSTEM FOR DEVICE RECONFIGURATION FOR DEFECT AMELIORATION

TECHNICAL FIELD

The present invention is related to manufacture of electronic devices, fault tolerance, quality-assurance testing, defect amelioration, and, in particular, to a method and system for reconfiguring configurable electronic devices, including demultiplexers, to ameliorate manufacturing defects and other defects detected in the devices.

BACKGROUND OF THE INVENTION

An enormous amount of research, development, and analysis has been carried out with regard to detecting and ameliorating manufacturing defects in manufactured products. These efforts have, in turn, led to the development and improvement of statistical analysis, testing strategies and procedures, and to great improvement in the design and manufacture of devices and products in order to provide cost-effective manufacture with minimum defects and maximum yields. As with any complex analytical and procedural task, the detection and amelioration of manufacturing defects is characterized by many different costs, benefits, and constraints that need to be balanced in order to provide optimal solutions. For example, it is possible, in many cases, to design manufactured articles with many levels of redundant components and automated failure detection, so that component failures can be circumvented by reconfiguring the device or article to use a spare operational component in place of a defective component. However, the design and manufacture of such highly redundant devices may greatly increase the cost of the devices and can lower device performance. When accurate and reliable testing of devices can be carried out, it may be more cost effective to design and manufacture simple, non-redundant-component-containing devices, and to test the devices in order to remove defective devices from the manufacturing output stream. While this strategy may significantly decrease the yield of operational devices, or, in other words, ratio of operational devices to total devices manufactured, the cost in discarding non-operational, defective devices may nonetheless be smaller than the cost of designing and manufacturing sufficient redundancy into the devices to tolerate defects. In fact, for highly complex electronic and computational devices, there are myriad different strategies, trade-offs, and considerations that need to be optimized in order to devise an effective manufacturing strategy that produces reliable devices at minimum cost.

As the size of features in integrated circuits and other electronic devices continues to decrease into the nanoscale range, the rate at which unavoidable manufacturing defects occur within devices sharply increases. The balances and tradeoffs considered in manufacturing microelectronics devices may not apply to devices that include nanoscale features, including nanowire-crossbar junctions and nanoscale transistors. Therefore, device designers and manufactures, device vendors, and, ultimately, users of devices have all recognized the need for continued research and development in the design and manufacture of nanoscale electronic devices, particularly with regard to cost-effective defect avoidance.

SUMMARY OF THE INVENTION

Embodiments of the present invention are directed to cost-effective defect amelioration in manufactured electronic devices that include nanoscale components. Certain embodiments of the present invention are directed to amelioration of defects in electronic devices that contain nanoscale demultiplexers. In certain embodiments of the present invention, the nanoscale-demultiplexer-containing devices include reconfigurable encoders. In one embodiment of the present invention, the table of codes within a reconfigurable encoder is permuted, and a device is configured in accordance with the permuted codes, in order to produce a permuted table of codes that, when input to an appropriately configured nanoscale demultiplexer, produces correct outputs despite defects in the nanoscale demultiplexer or in devices connected to the nanoscale demultiplexer.

BRIEF DESCRIPTION OF THE DRAWINGS

FIG. 10 illustrates a first step in the reconfiguration computation that represents one embodiment of the present invention.

FIG. 11 illustrates a matching operation that represents a comparison operation used in method and system embodiments of the present invention.

DETAILED DESCRIPTION OF THE INVENTION

Embodiments of the present invention are directed to cost-effective amelioration of defects in manufactured electronic devices. In particular, certain embodiments of the present invention are effectively applied to the amelioration of defects in nanoscale demultiplexers. In a first subsection, several types of defects that occur in nanoscale demultiplexers are described. In a second subsection, nanoscale demultiplexers are described, in overview. A third subsection describes one approach to configuring a nanoscale demultiplexer according to one embodiment of the present invention. A fourth subsection provides a C++ program that implements the reconfiguration calculation component of one embodiment of the present invention.

Types of Defects that Occur in Nanoscale Demultiplexers

Figure 1:
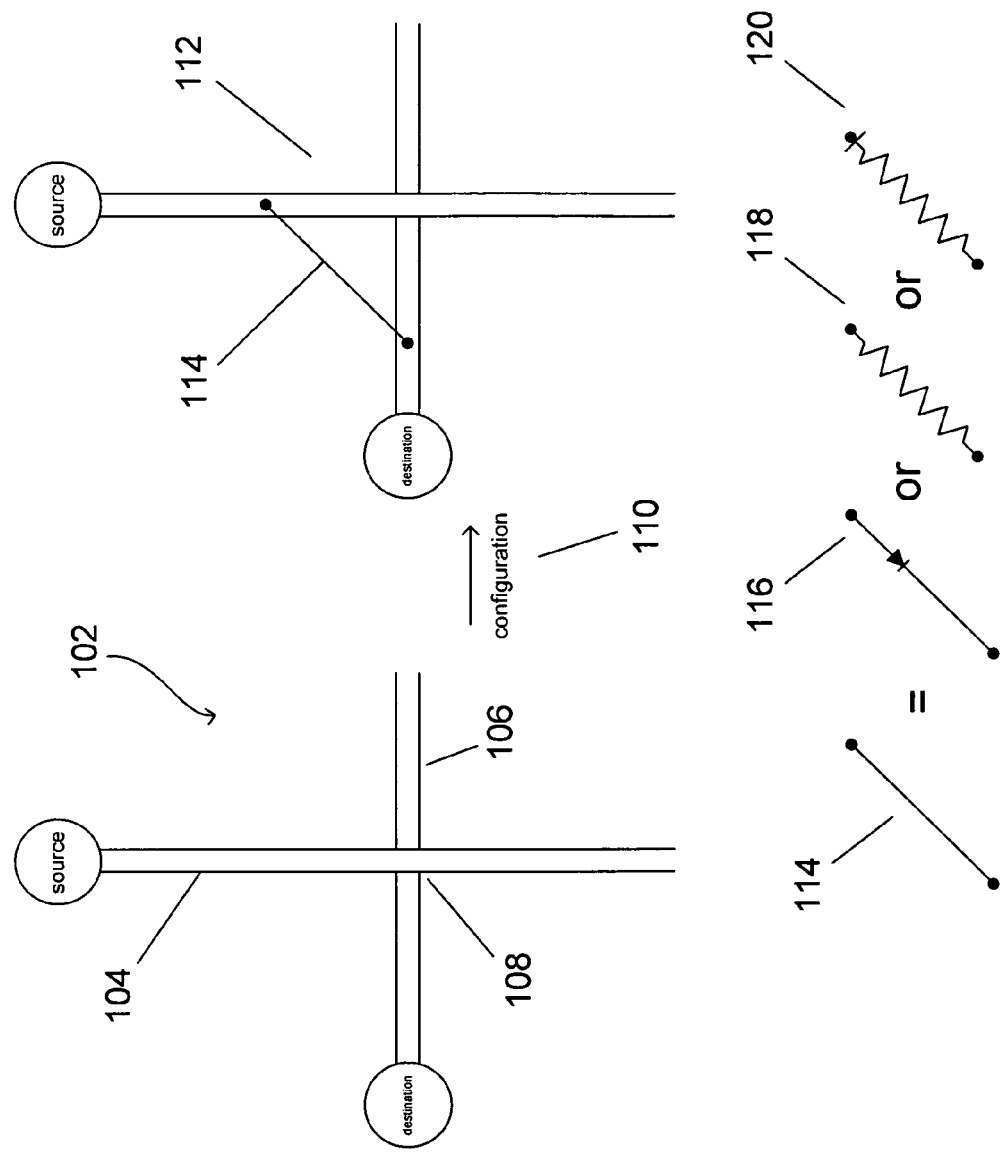
FIG. 1 illustrates a basic nanowire junction and configuration of the nanowire junction.

Certain nanoscale demultiplexers, and other nanoscale electronic devices, are based on junctions between nanowires that can be designed to have various different useful electronic properties. FIG. 1 illustrates a basic nanowire junction and configuration of the nanowire junction. A nanowire junction 102 includes a first nanowire 104 and a second nanowire 106, generally approximately perpendicular to one another, that overlie one another to form a junction 108 in which a small portion of the first nanowire. 104 overlies a complementary small portion of the second nanowire 106. Depending on the material used in, and design of, the first and second nanowires, and, in certain cases, depending on the history of voltages and currents applied to the nanowire junction, the nanowire junction 108 can have various different electronic properties.

One useful state of a nanowire junction is an open state, in which the nanowire junction is effectively an insulator, electronically isolating the first nanowire from the second nanowire. Another useful state of a nanowire junction is a closed state, in which the first nanowire is electronically interconnected with the second nanowire through the nanowire junction. Application of particular voltages or currents across a nanowire junction may change the state of the junction from "open" to "closed," in a process referred to as "configuration" 110. In general, configuration voltages and currents have larger magnitudes than those of operational voltages and currents used to power the device during normal operations. In FIG. 1, an open nanowire junction 108 is configured by application of particular configuration voltages or currents to produce a closed nanowire junction 112, where the closed state is symbolically represented by a bar-like interconnection 114 between the two nanowires. By reversing the polarities of the applied configuration voltages or currents, a nanowire junction in the closed state can be configured to the open state. The bar-like symbol representing the closed state 114 may be alternatively shown as a diode-like interconnection symbol 116, a resistor-like interconnection symbol 118, or a memristor-like interconnection symbol 120, depending on the materials used in, and the design of, the nanowire junction, which, in turn, influence the electronic properties of the nanowire junction. In certain cases, simple conductive connections are preferable, while, in other cases, diode-like, resister-like, or memristor-like interconnections are desirable. By changing the materials and/or design of a nanowire junction, the closed-state nanowire junction may stably exhibit any of simple-connection, diode-like, resistor-like, or memristor-like properties.

Figure 2:
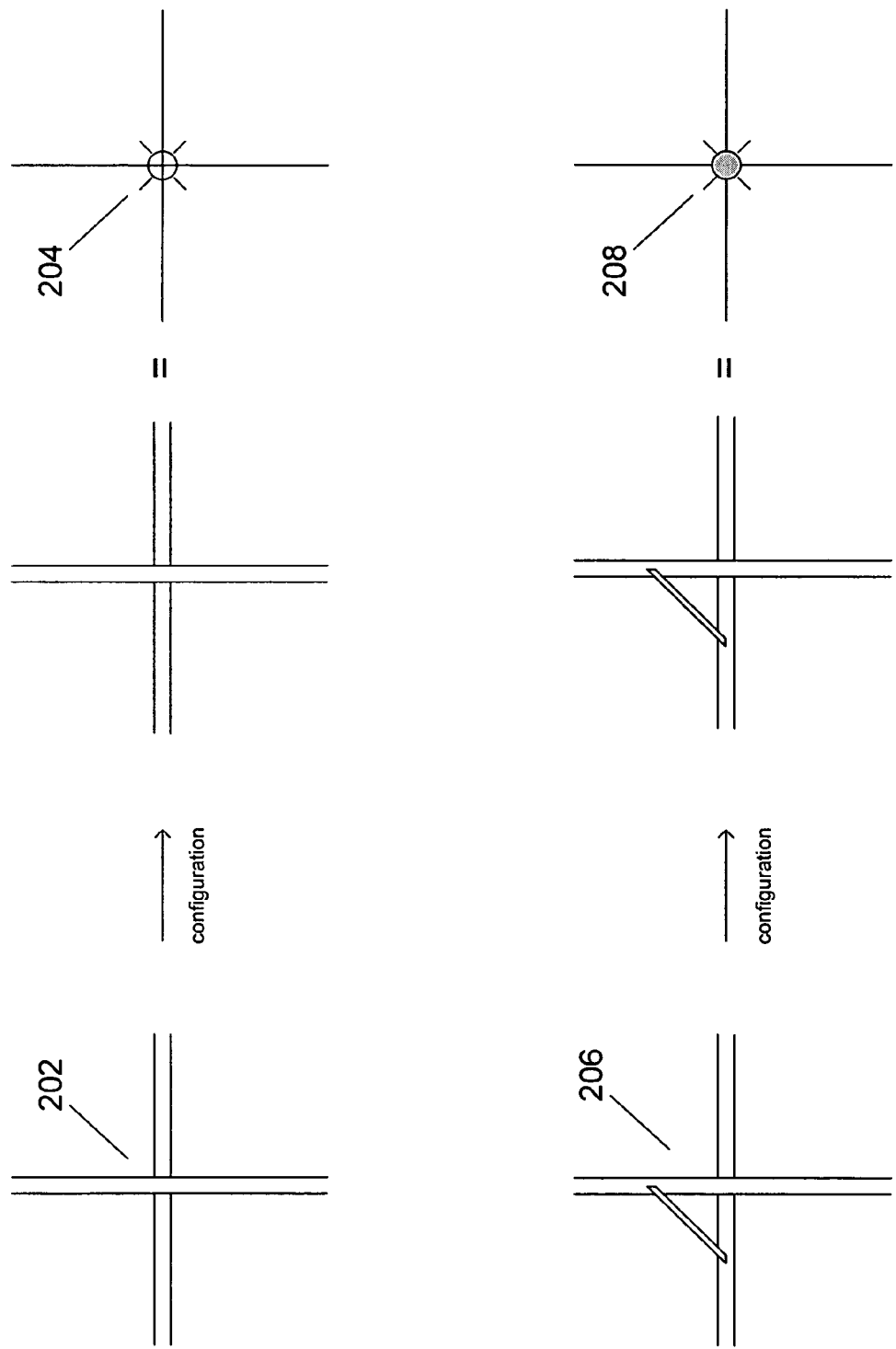
FIG. 2 illustrates two types of nanowire-junction defects.

There are two principal types of nanowire-junction defects. FIG. 2 illustrates two types of nanowire-junction defects. The first type of nanowire-junction defect is the open defect, in which a nanowire junction 202 remains permanently in the open state, regardless of application of configuration voltages or currents. An open defect is illustrated by an open-defect symbol 204. A closed defect occurs when a nanowire junction is permanently in a closed state 206, despite application of configuration voltages or currents designed to alter the state of the nanowire junction to the open state. A closed-defective nanowire junction is represented by the closed-defect symbol 208. Additional types of nanowire-junction defects may include intermittently defective nanowire junctions that nondeterministically and unreliably switch between a closed state and an open state. In certain cases, such intermittent defects can be ameliorated by assigning them to the open-defect category in applying methods of the current invention.

Many systematic defects may occur, in which entire sequences or blocks of nanowire junctions are defective, but, in general, such systematic defects can nonetheless be treated by considering individual nanowire junctions within the sequence or blocks to be individually defective.

Thus, in summary, nanoscale demultiplexers and other nanoscale electronic devices may be based partly or entirely on nanowire junctions or other such nanoscale features. In certain configurable devices, each nanowire junction can be configured to be in an open state or a closed state. Defective nanowire junctions may be either permanently open or permanently closed, despite application of configuration voltages or currents. It should be noted that, in certain cases, defects in devices electrically connected to a nanoscale demultiplexer or other nanoscale electronic device may produce errors in a device or component that includes both the devices electrically connected to the nanoscale demultiplexer and the nanoscale demultiplexer that can be modeled as arising from one or more of the above-discussed nanoscale demultiplexer defects in the nanoscale demultiplexer. Thus, the methods of the present invention can be used to ameliorate not only defects that occur in nanoscale demultiplexers and other nanoscale electronic devices, but also in microscale, sub-microscale, or nanoscale electronic devices to which they are connected, by modeling defects in the other devices as arising from defects in the nanoscale demultiplexer. In the following discussions, nanoscale-demultiplexer defects are understood to be nanoscale-demultiplexer defects or defects in devices connected to a nanoscale demultiplexer that can be modeled as nanoscale-demultiplexer defects.

In general, a nanoscale device is a device including components having at least one dimension, parallel to a plane of a substrate on which the component is fabricated, of less than 100 nanometers ("nm"). As fabrication techniques improve, a nanoscale device may be defined as a device including components having at least one dimension, parallel to a plane of a substrate on which the component is fabricated, of less than 50 nm. or less than 20 nm.

Nanoscale Demultiplexers

Figure 3A:
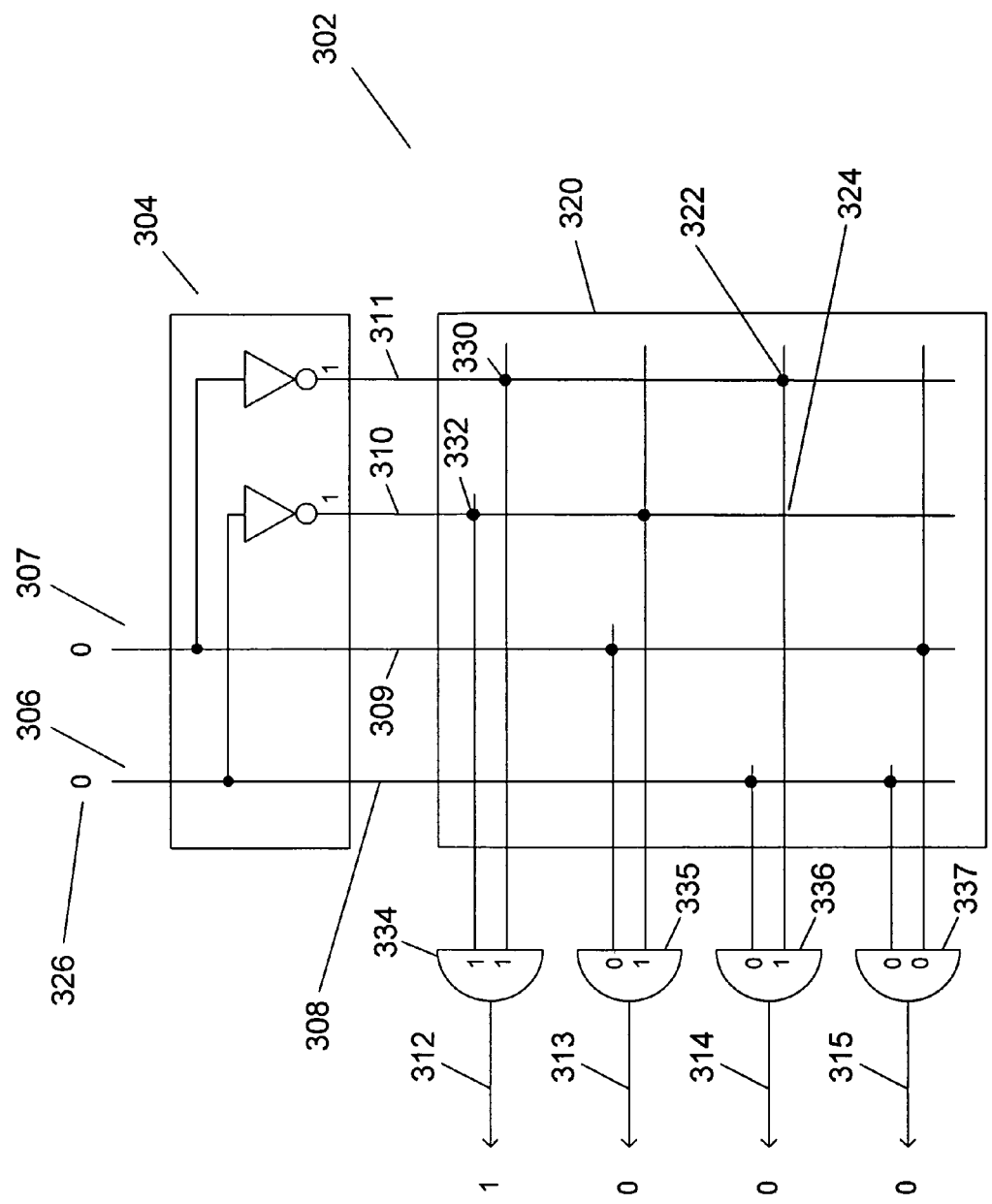
FIGS. 3A-D illustrate selection of each addressed nanowire signal line by one of the four possible input addresses.

FIGS. 3A-D illustrate a simple, two-address-line, four-output-line canonical nanoscale demultiplexer. Referring to FIG. 3A, the nanoscale demultiplexer 302 includes an encoder 304 that receives two address lines 306-307 and encodes a two-bit address input via the address lines into four-bit output signals that are output on four output signal lines 308-311. For each signal input on the two address lines 306-307, a particular one of four addressed signal lines 312-315 carries a high voltage or high current signal, corresponding to binary value "1," and the remaining addressed signal lines 312-315 carry low voltage or low-current signals corresponding to binary value "0." Of course, depending on the materials and design of a demultiplexer, the voltage/current conventions may be reversed, so that binary value "0" corresponds to high voltage and binary value "1" corresponds to a low voltage or low current. In general, the addressed signal lines 312-315 are nanoscale signal lines, the signal lines output from the encoder 308-311 are nanoscale, submicroscale, or microscale, and a nanoscale crossbar 320 converts the four-signal-line output of the encoder 304 into selection of one of the addressed signal lines 312-315. Although the encoder and addressed signal lines 304 and 306-307 may be nanoscale components, the address signal lines 306-307 and encoder 304 are often submicroscale or microscale components, and the nanoscale demultiplexer 302 thus provides an interface between microscale or submicroscale electronics to nanoscale electronics within an electronic device that includes both microscale or submicroscale and nanoscale components. In the canonical nanoscale demultiplexer shown in FIG. 3A, the closed-state nanowire junctions are simple conductive junctions, illustrated by a filled disk, such as filled disk 322, while open-state nanowire junctions, such as open-state nanowire junction 324, have no disks.

Figure 3B:
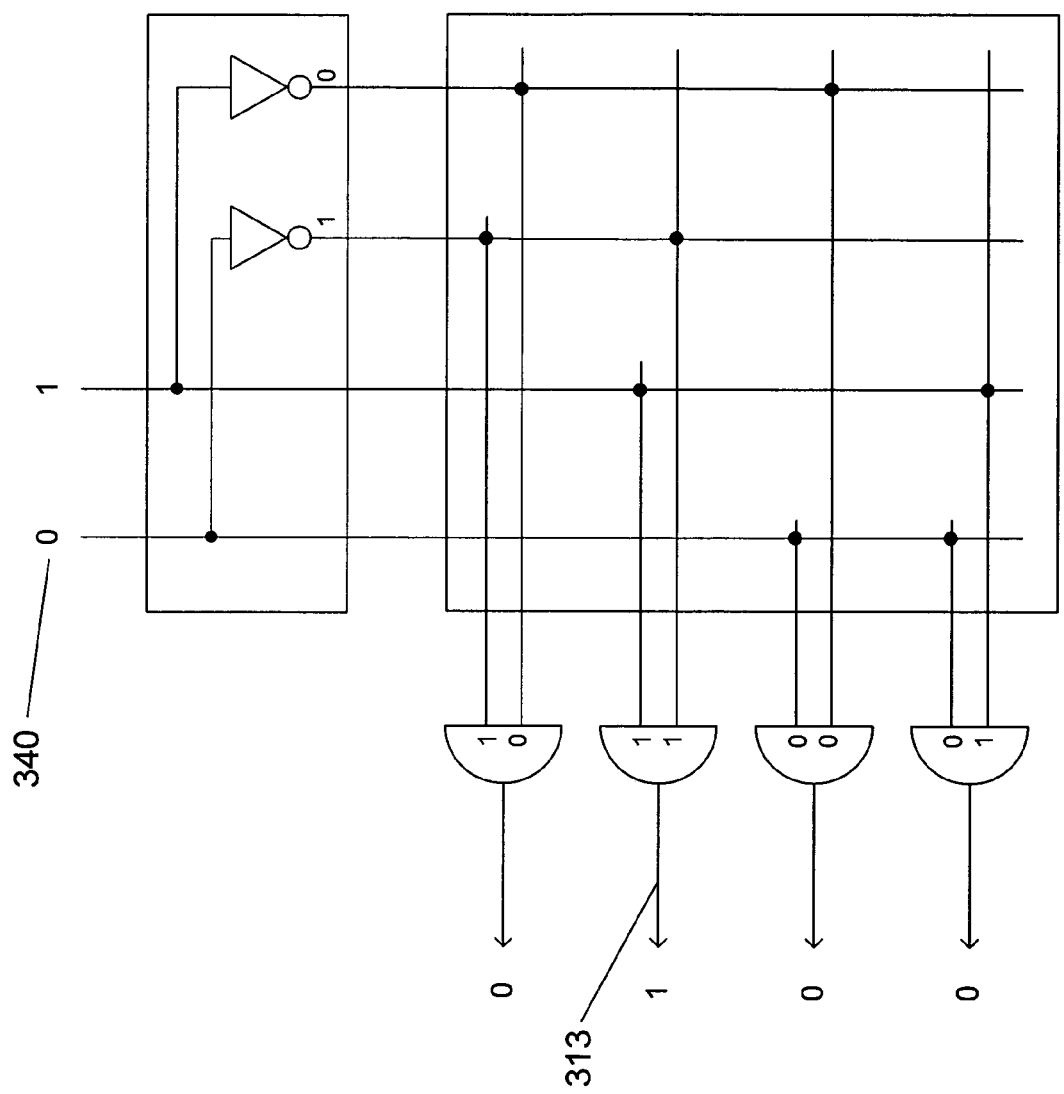
Figure 3C:
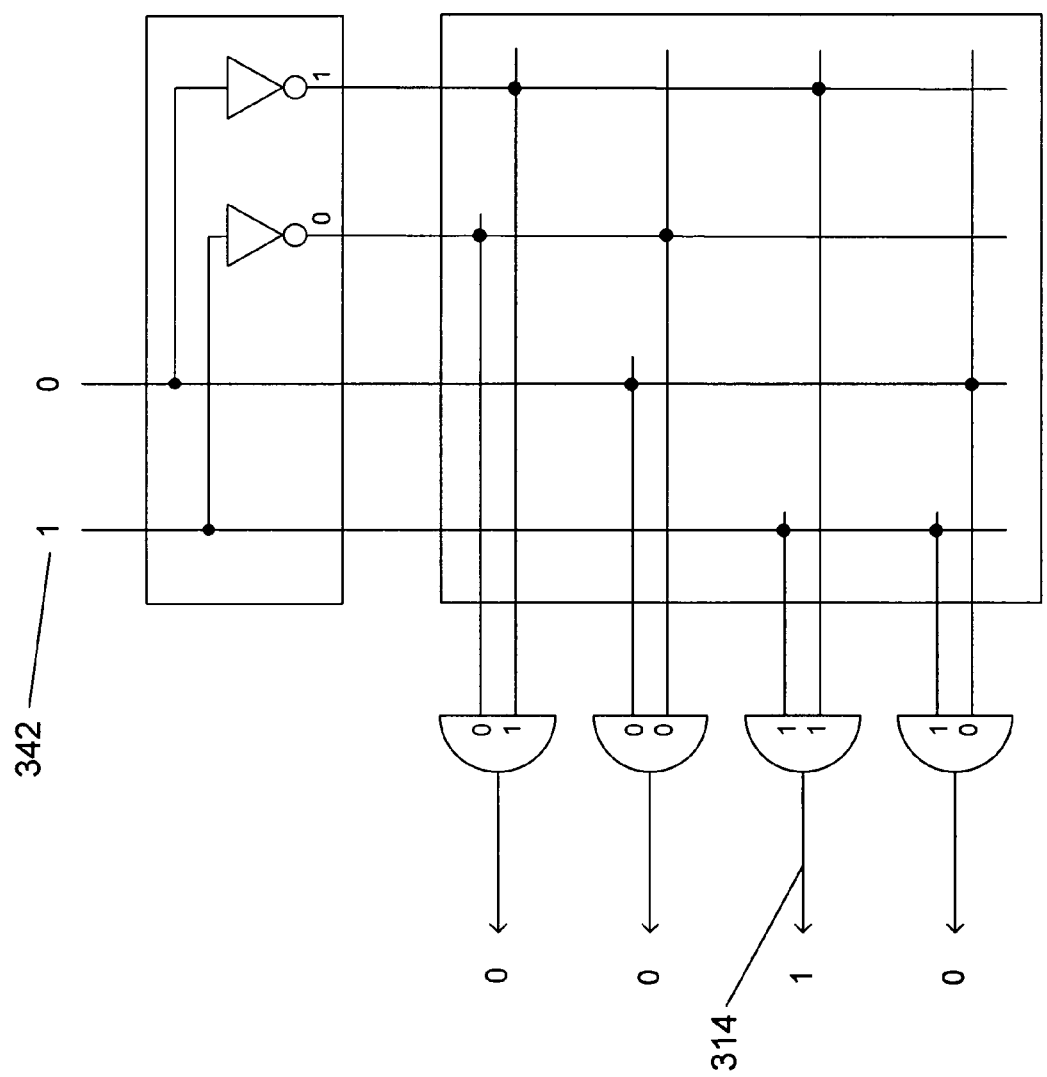
Figure 3D:
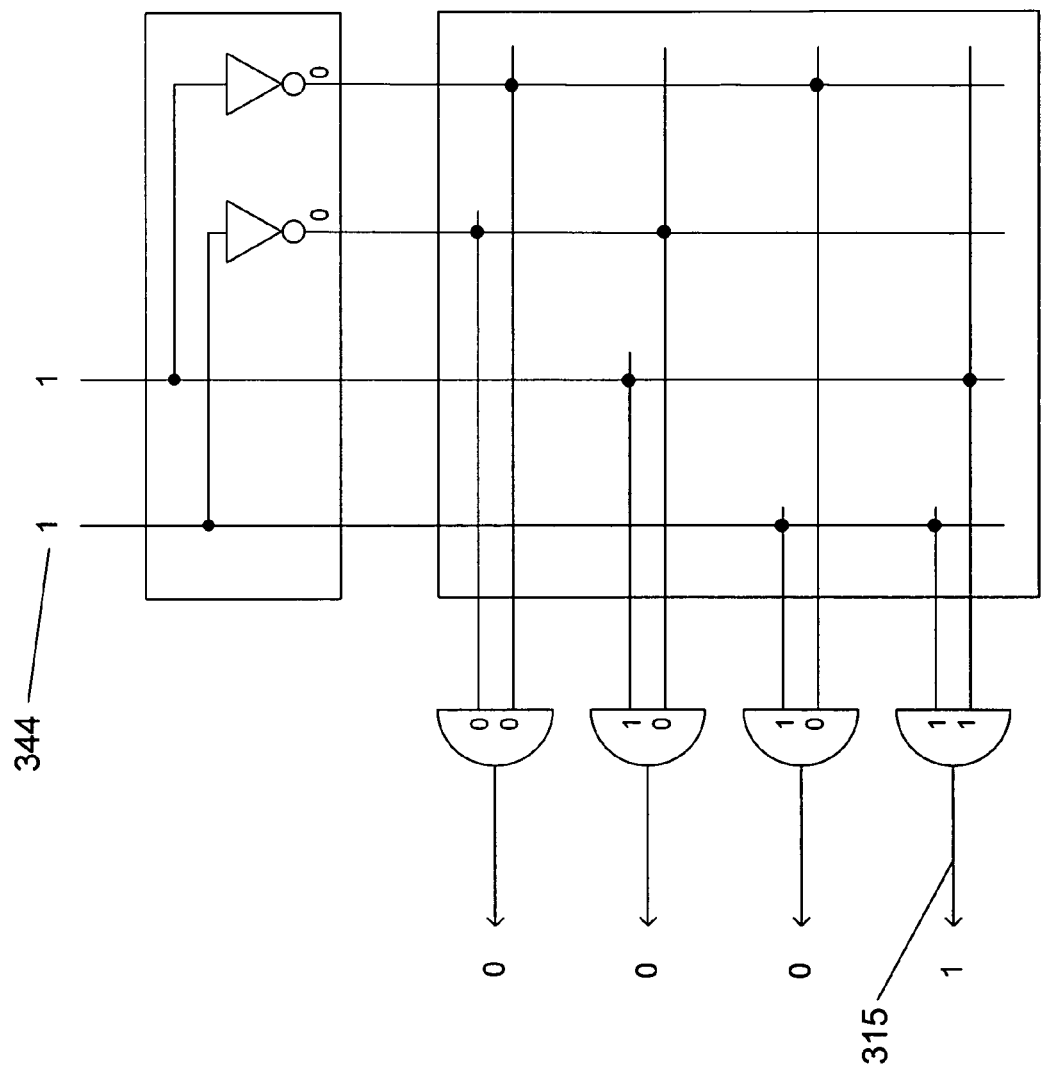

FIGS. 3A-D illustrate selection of each addressed nanowire signal line by one of the four possible input addresses. In FIG. 3A, the binary address {0,0} 326 is input to the input address lines 306-307, resulting in selection of addressed nanoscale signal line 312 and deselection of the remaining addressed nanoscale signal lines 313-315. The encoder passes the input signals through to output signal lines 308 and 309 and inverts the input signals and passes the inverted signals to output signal lines 310 and 311. In this case, because of closed-state nanowire junctions 330 and 332, both inputs to the AND gate 334 have Boolean value "1," and therefore the AND gate produces an output Boolean value "1" signal. In all other cases, one or both of the input signal lines to the AND gates 335-337 have Boolean value "0," and therefore the outputs from the AND gates 335-337 is Boolean value "0." FIG. 3B illustrates input of the address {0,1} 340 and selection of the second addressed signal line 313. FIG. 3C illustrates input of the address {1,0} 342 and selection of the third addressed nanoscale signal line 314. Finally, FIG. 3D illustrates input of the address {1,1} 344 and selection of the fourth nanoscale addressed signal line 315. Thus, each of the addressed nanoscale signal lines 312-315 is selected by the nanoscale demultiplexer by a particular two-binary-digit address input to the input signal lines 306-307. The addressed nanoscale signal line selected by, a particular input address carries a logic "1" signal, while the unaddressed, or unselected, nanoscale signal lines carry logic signal "0."

Figure 4:
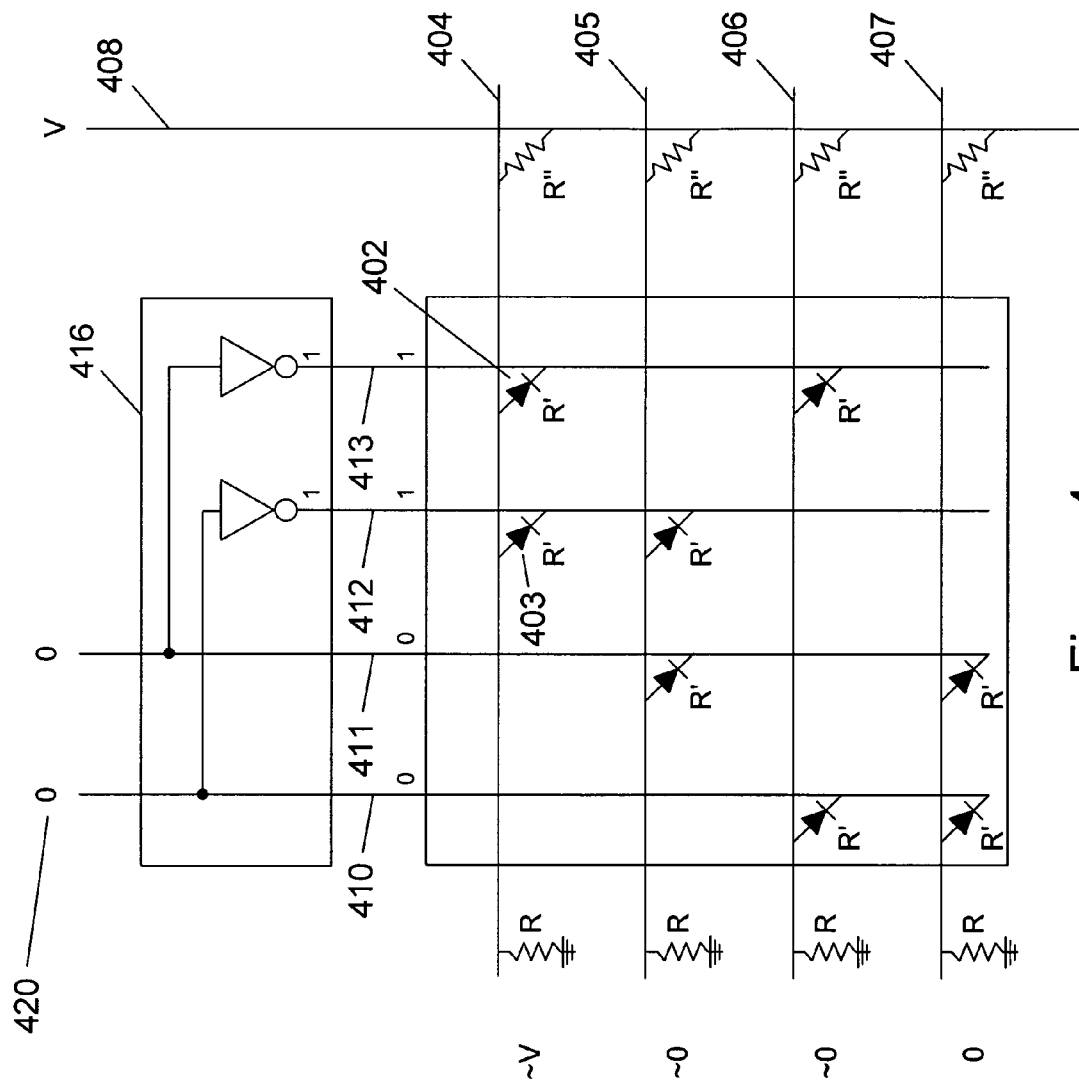
FIG. 4 shows one implementation of the canonical nanoscale demultiplexer shown in FIG. 3A.

FIG. 4 shows one implementation of the canonical nanoscale demultiplexer shown in FIG. 3A. In the implementation of the nanoscale demultiplexer shown in FIG. 4, the closed-state nanowire junctions, such as closed-state nanowire junction 402, have diode-like characteristics. Each of the addressed nanoscale signal lines 404-407 are connected to a power line 408 and to some number of the signal lines 410-413 output by the encoder 416 through diode-like closed-state nanowire junctions. In FIG. 4, the address {0,0} 420 is input to the encoder which outputs, on the four output lines 410-413 the corresponding internal codeword (0,0,1,1). In the case of address nanoscale signal line 404, both of the diode-like closed-state nanowire junctions 402 and 403 connect the addressed nanoscale signal line 404 to signal lines 412 and 413 output by the encoder, both having logic state "1." Thus, the addressed nanoscale signal line 404 carries a voltage signal approximately equal to the voltage of the power line 408, since the diodes 402 and 403 are not forward biased to pass current, and because, even were the diodes forward biased, there would be little or no effective voltage drop across the nanowire junctions. The non-selected addressed nanowires 405-406 each have one or more diode-like nanowire junctions interconnected to one of output signal lines 410 and 411, which carry logic state "0," or 0V, signals. Thus, given that the resistance through the nanowire junctions R' is significantly less than the resistance of the device, R, the voltage on the power line 408 is shunted through at least one diode-like nanowire junction to ground, leaving the non-selected addressed signal lines 405-407 close to 0 voltage, or carrying logic value "0."

Figure 5:
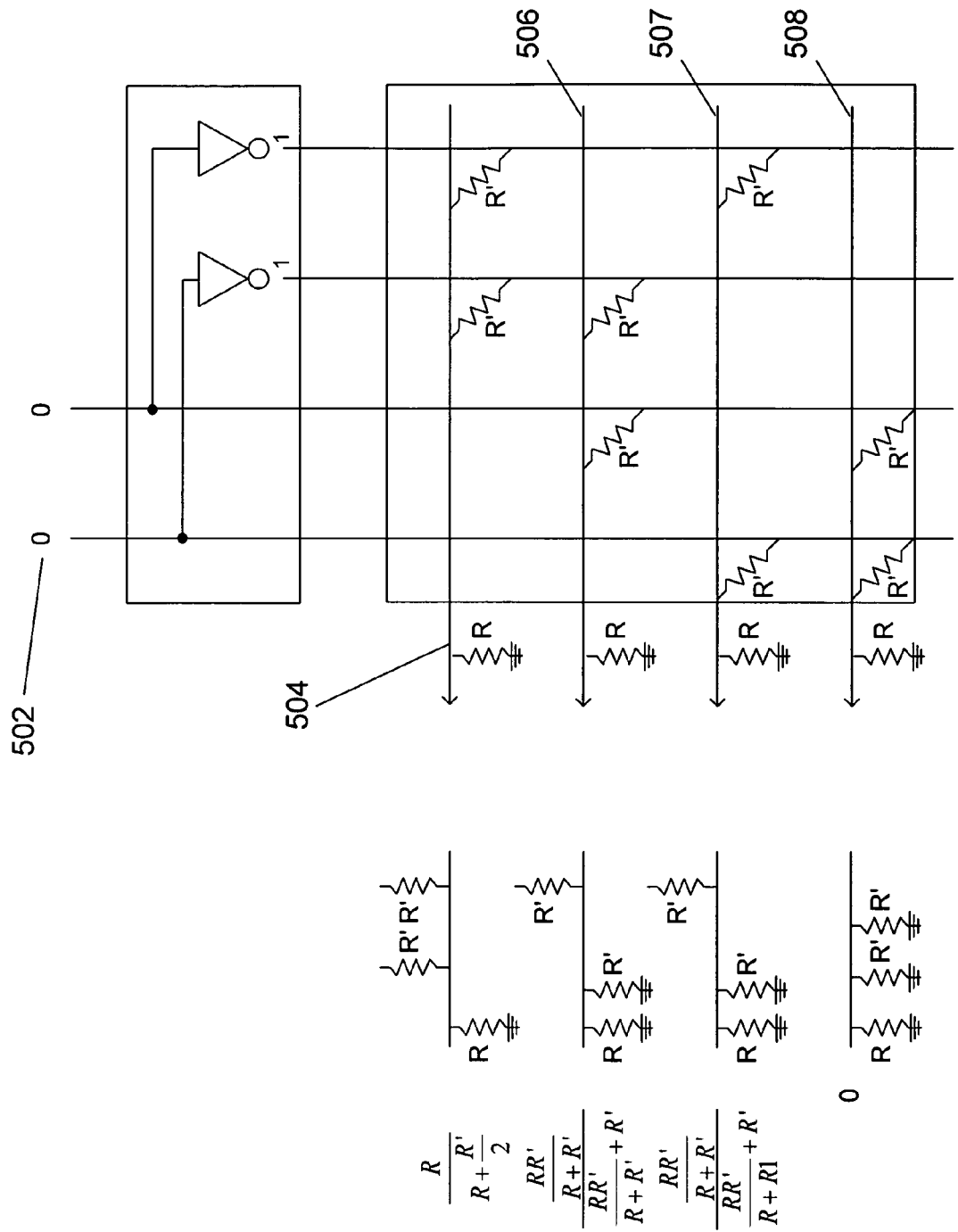
FIG. 5 shows the canonical nanoscale demultiplexer of FIG. 3A implemented using resistor-like closed-state nanoscale junctions.

FIG. 5 shows the canonical nanoscale demultiplexer of FIG. 3A implemented using resistor-like closed-state nanoscale junctions. Given that resistance through the resistor-like nanowire junctions R' is significantly less than the resistance of the device, R, when the address {0,0} 502 is input to the nanoscale demultiplexer, the selected addressed nanoscale signal line 504 has close to the voltage of logic state "1," assumed to be 1 V, in the current example, while the unselected addressed signal lines 506-508 have voltages less than $$\frac{V}{2},$$

and, in one case, 0V. In larger demultiplexers, the voltage or current ranges for selected and deselected nanowires may have different ranges, depending on the weight profile of the codes used to design the demultiplexer.

Figure 6:
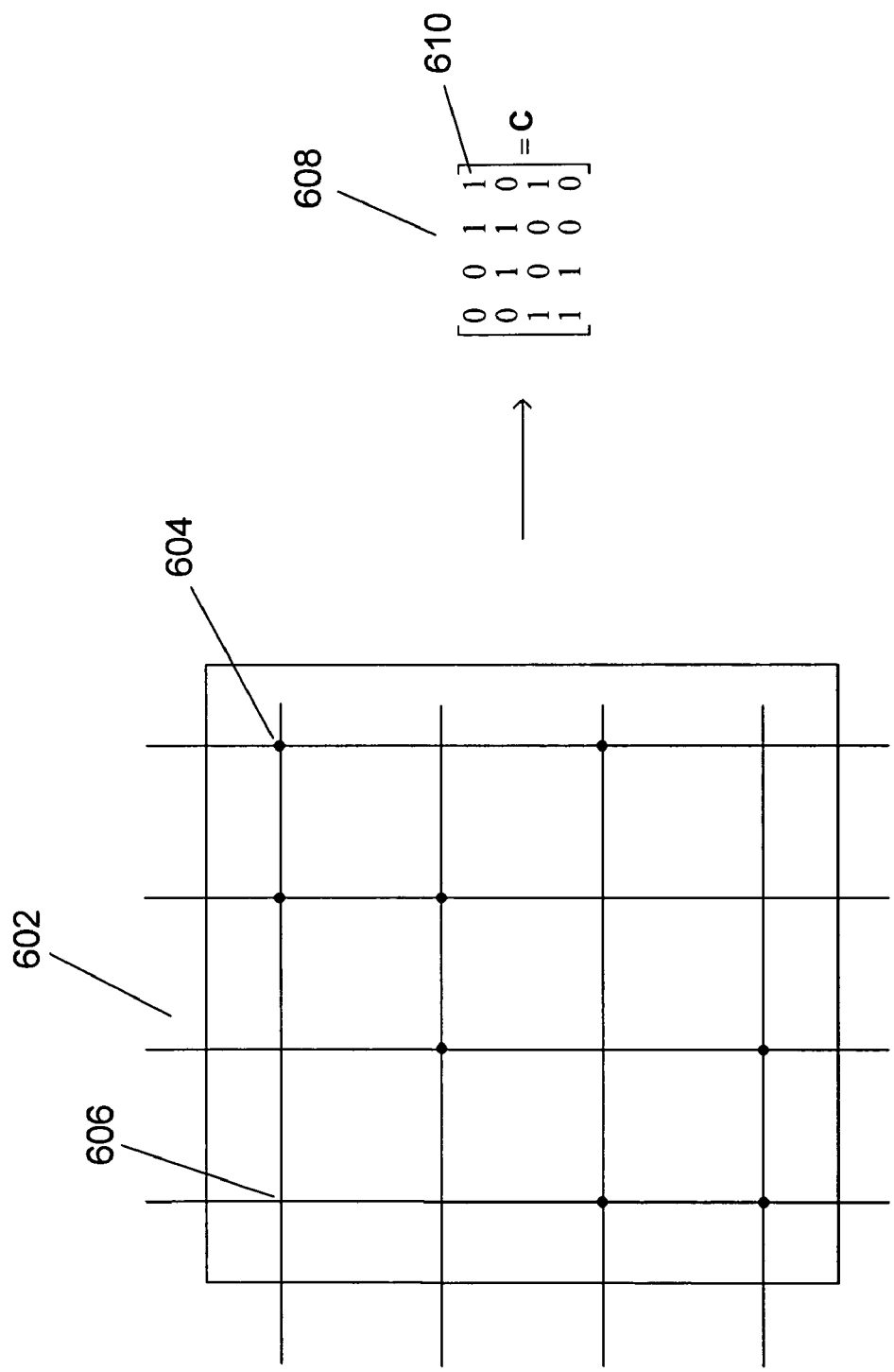
FIG. 6 illustrates a configuration matrix C.

FIG. 6 illustrates a configuration matrix C. In FIG. 6, the nanowire-crossbar 602 portion of the nanoscale demultiplexer discussed with reference to FIGS. 3A-5, is shown in canonical representation, with closed-state nanowire junctions represented by filled disks at the junction, such as filled disk 604, and open-state nanowire junctions shown without disks, such as open-state nanowire junction 606. The pattern of open-state and closed-state nanowire junctions represents the configuration of the demultiplexer. The configuration can be represented by a matrix C 608, in which the pattern of open-state and closed-state nanowire junctions are represented as Boolean values "0" and "1," respectively. The configuration matrix C represents the configuration of either the diode-like implementation, shown in FIG. 4, or the resistor-like implementation, shown in FIG. 5, of the canonical demultiplexer. The configuration matrix C can also be viewed as a table of internal codewords, each codeword comprising four digital bits. Thus, the first row 610 of C is equivalent to the codeword (0,0,1,1). Each internal codeword corresponds to a two-bit address input through the input signal lines (306-307 in FIG. 3A). Thus, for the configuration shown in FIG. 6, internal codeword (0,0,1,1) corresponds to the external, two-bit address {0,0}, as can be seen in FIGS. 3A, 4, and 5. The table of internal codes, or configuration matrix C, is often computed from abstract codes used in error-control encoding and other information encoding techniques. Examples include linear binary codes frequently employed in digital communications. Such codes can be represented as a table of codewords.

Figure 7:
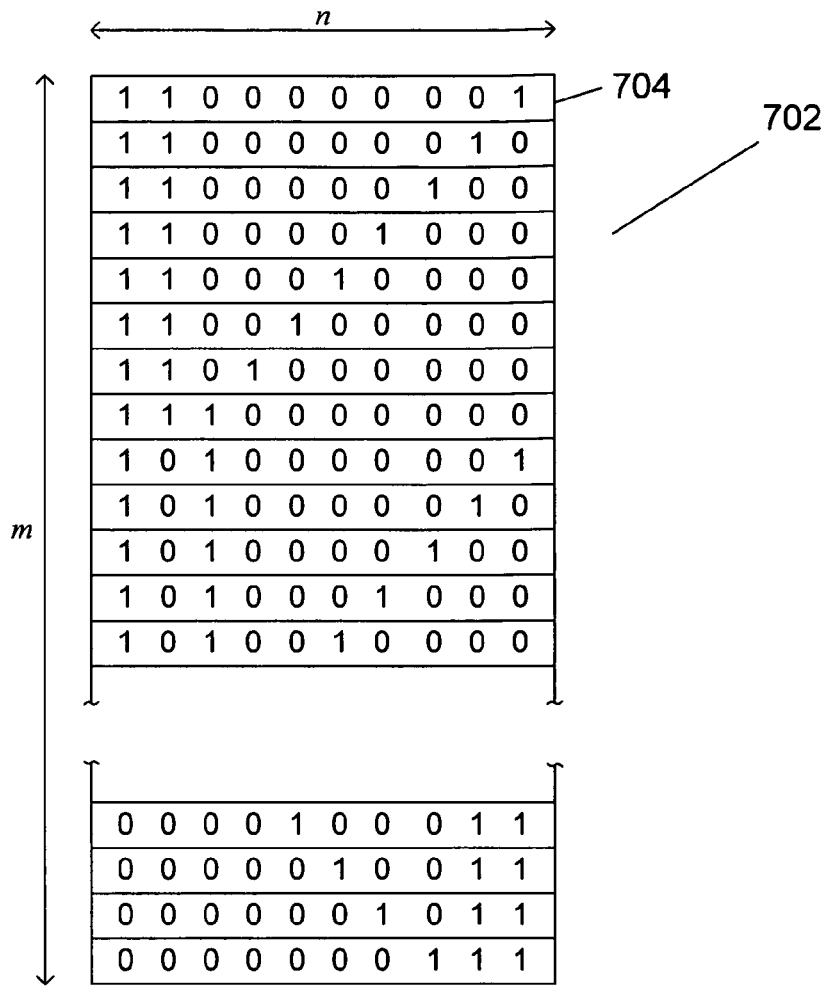
FIG. 7 illustrates one particular binary code.

FIG. 7 illustrates one particular binary code. In FIG. 7, the table 702 represents the binary code. Each row in the table, such as row 704, contains the binary representation of one unique codeword within an entire set of codewords that constitutes the code. A code generally comprises m codewords, each codeword having a fixed length, in binary digits, of n. Different types of binary codes have different properties. One type of binary code is referred to as a "constant weight code." In a constant weight code, each codeword of the code has a fixed number of "1" binary digits and "0" binary digits.

Figure 8:
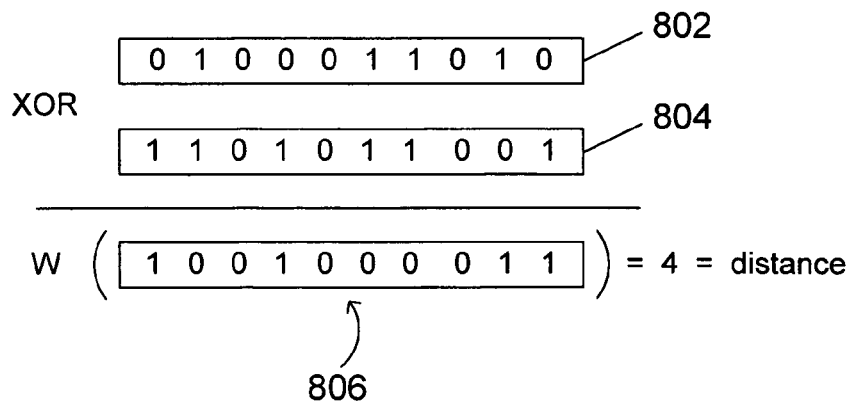
FIG. 8 illustrates computation of the distance between two codewords.

In many binary codes, the minimum difference between any two arbitrary selected codewords is guaranteed to have some minimum value. FIG. 8 illustrates computation of the Hamming distance between two codewords. In FIG. 8, a first codeword 802 and a second codeword 804 are shown in binary representation. In order to compute the distance between the two codewords, a bitwise XOR operation is carried out on the two codewords to produce a resultant binary value 806. The weight of that resultant binary value, or, equivalently, the number of "1" binary digits in the resultant binary value, is equal to the distance between codewords 802 and 804. In other words, the distance between two binary codewords is the number of positions at which the binary digits of the two codewords differ. Often, the internal codewords for a nanoscale demultiplexer are codewords selected from a constant-weight binary code designed to have a minimal distance between arbitrarily selected codewords of a reasonably large value. When a resistor-like closed-state nanowire-junction implementation of a demultiplexer is employed, as shown in FIG. 5, the voltage differences between the selected and unselected addressed signal line are guaranteed to be well separated, and thus the selected signal line can be readily distinguished from the unselected signal lines, when the internal codewords are selected from a constant-weight code with reasonably large minimum distance. Furthermore, when the length of the internal codes is significantly greater than the number of input address lines, and the minimal distance between arbitrarily selected internal codewords is greater than or equal to a number i, the demultiplexer may correctly operate when even up to i-1 nanowire junctions along a particular addressed nanowire signal line are defective. In general, devising the internal codewords for a demultiplexer is a computationally intensive task, although, in many cases, already known codes can be employed.

Because nanowire junctions and nanowire crossbars are so small, they cannot currently be manufactured by the well-understood photolithographic processes used to manufacture microscale and submicroscale integrated circuits. The manufacturing processes so far devised for manufacturing nanoscale features produce defects at a significantly greater rate than the rate of defects produced by standard photolithographic processes. Therefore, detection and amelioration of defective nanowire junctions typically becomes a critical issue that determines the feasibility of manufacturing devices that contain them. One approach to handling the high defect rates for nanoscale devices is to employ a great deal of redundancy to allow the devices to be configured around the defects. In the case of demultiplexers, as discussed above, one can select relatively large internal codes, compared to the length of the external addresses, so that any particular address signal line can tolerate up to some fixed number of defective nanowire junctions, within the nanowire crossbar, and still be selected uniquely by the corresponding external address. However, the length of the internal codewords directly corresponds to the number of signal lines output by the encoder, and is thus directly reflected in the complexity and size of the nanowire crossbar used to implement the demultiplexer. This additional nanoscale hardware is costly to manufacture, and the defect ratio may even increase non-linearly with the size of the device, providing smaller and smaller advantages as the number of internal signal lines increases.

Embodiments of the present invention are directed to a different approach to defect amelioration. Rather than relying solely on redundancy to ameliorate detected defects, embodiments of the present invention seek to reconfigure demultiplexers in order to overcome detected defects. One possible approach to reconfiguration would be to recompute the internal codes de novo, so that the internal code assigned to each addressed nanowire signal line is not affected by any defective nanowire junctions along that signal line. However, de novo computation of internal codes may be a computationally intensive task, and may be impractical for use in manufacturing of even modest-sized nanowire crossbars. Again, internal codes designed for demultiplexers take into account many different constraints and characteristics, including proper separation, or sufficiently large minimal distances, between codewords, desired average or fixed weights of codewords, and other such constraints and characteristics. Rather than recompute the internal codes, de novo, method and system embodiments of the present invention instead attempt to permute the rows of a configuration matrix C so that the internal codeword assigned to each addressed signal line is not affected by any defective nanowire junctions that connect the addressed signal line to encoder output signal lines. In alternative embodiments of the present invention, the columns of the configuration matrix C may be instead permuted. Because the internal codes are permuted within the configuration, and not computed de novo, all of the characteristics of the original configuration with respect to various coding constraints are preserved, since the coding constraints generally do not depend on the order of codewords in a codeword table defining a code. It may be the case that, for a particular pattern of defects detected within a nanowire crossbar, no permutation of the configuration matrix C can produce a reconfiguration matrix R that, when used to reconfigure the demultiplexer, masks or tolerates the detected defects. Thus, the configuration-matrix-permutation method of the present invention does not necessarily produce a yield of 100 percent operational devices. However, configuration-matrix-permutation methods of the present invention can ameliorate a large number of defects, and can thus greatly increase the yield of operational demultiplexers with respect to non-reconfigured demultiplexers with defects or reconfigurable demultiplexers that depend on small-to-moderate levels of redundancy. In short, method and system embodiments of the present invention permute the configuration matrix C of a demultiplexer in order to produce a reconfiguration matrix R that can be used to reconfigure the demultiplexer to avoid incorrect operation of the demultiplexer in the presence of defective nanowire junctions.

Method and System Embodiments of the Present Invention

As discussed in the previous subsection, method and system embodiments of the present invention are directed to defect amelioration within demultiplexers and other electronic devices by permuting a configuration matrix C, which represents the configurations of components within an array, or crossbar, in order to produce a reconfiguration matrix R that reassigns codewords of the configuration matrix C such that any defects present within the array or crossbar do not adversely affect operation of the demultiplexer or other device. In other words, the configuration matrix C specifies a set of internal codewords that represent how the demultiplexer needs to be configured, both by configuring nanowire junctions and by configuring the encoder that translates external addresses to internal codewords, and methods of the present invention permute the configuration matrix C to produce a reconfiguration matrix R for specifying a alternative demultiplexer configuration that produces an operational demultiplexer, despite defects identified in the demultiplexer. In some cases, a device initially configured according to the configuration matrix C may need to be physically reconfigured according to the reconfiguration matrix R. In other cases, the defects are identified prior to initial configuration, and the device needs only to be initially configured in accordance with the reconfiguration matrix R.

Figure 9:
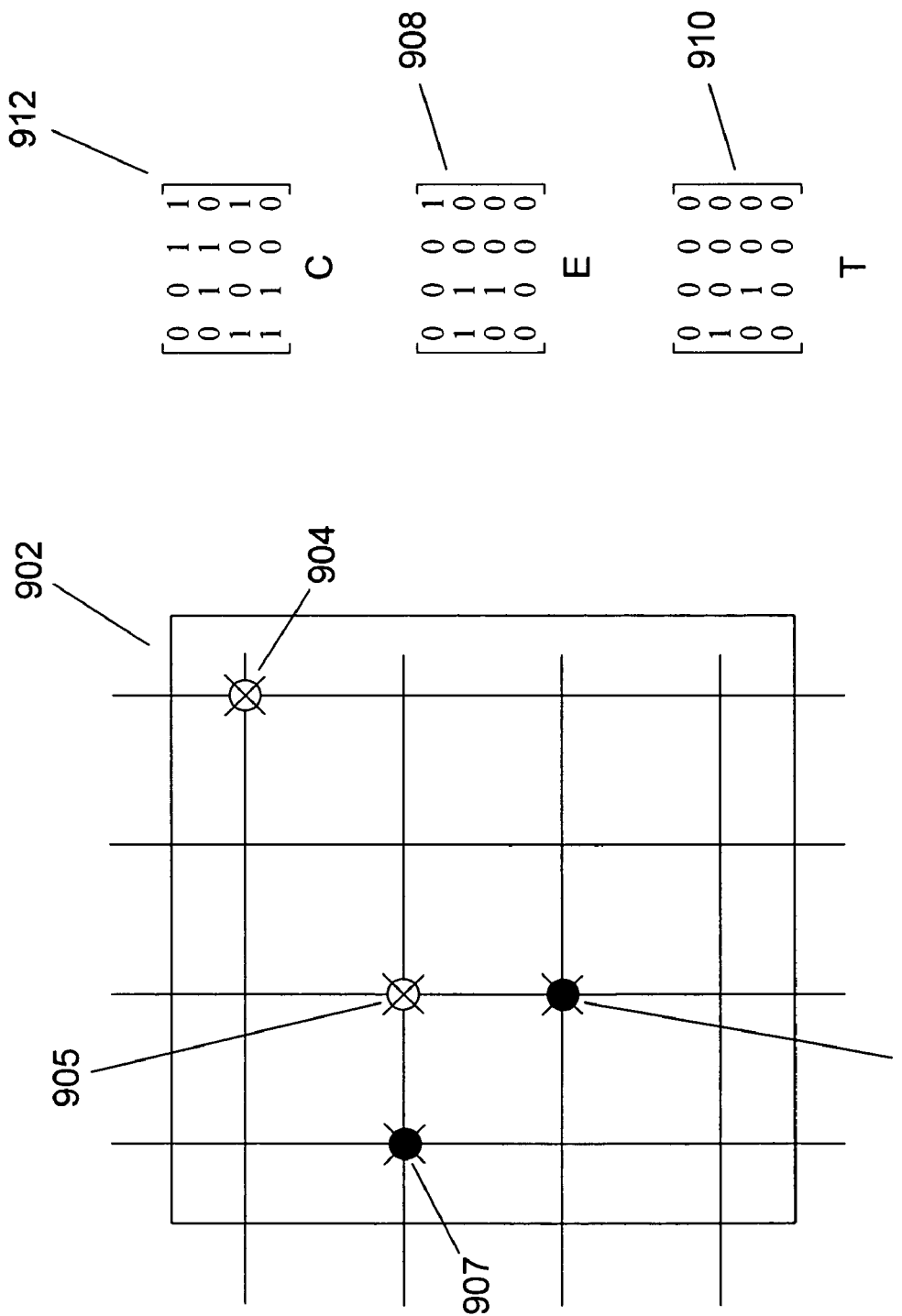
FIG. 9 illustrates a defective device and three matrixes used to characterize the defective device.

FIG. 9 illustrates a defective device and three matrices used to characterize the defective device. In FIG. 9, the defects within a 4×4 crossbar 902 are shown, using the defect-illustration conventions discussed above with reference to FIG. 2. The crossbar has two open defects 904-905 and two closed defects 906 and 907. The pattern of open defects and closed defects is abstractly represented by the matrices E 908 and T 910. The matrix E includes a Boolean value "1" at each position corresponding to the position of a defective junction in the crossbar 902. Thus, since the crossbar has four defects, there are four Boolean values "1" in the matrix E 908. The matrix T indicates which, of the defects indicated by the matrix E, are closed defects. Each closed defect is indicated, in the matrix T, by Boolean values "1." The crossbar 902 has two closed defects 906 and 907, and thus matrix T includes two Boolean values "1" indicating these defects. For the exemplary defective crossbar 902 in FIG. 9, it is assumed, for the sake of discussion, the crossbar was designed to be configured according to the configuration matrix C 912, the same configuration matrix that describes the configurations of the crossbar and the demultiplexer of FIGS. 3A-5. The goal of method and system embodiments of the present invention is to permute the configuration matrix C 912 to produce a reconfiguration that assigns the internal codewords such that the defective nanowire junctions do not adversely impact operation of the crossbar or demultiplexer containing the crossbar.

FIG. 10 illustrates a first step in the reconfiguration computation that represents one embodiment of the present invention. As shown in FIG. 10, the matrix E 908 is sorted by the weight of the rows. Rather than sort the rows in place, a remapping vector S 1002 is employed to permute the rows of E so that the rows of E are sorted in descending order, from the top row, by weight. Thus, for example, the second row 1004 of the matrix E has weight 2, and is the row with greatest weight in matrix E. Therefore, the first row in the sorted matrix E is row 2, indicated by the value 2 1006 in the first position of the remapping vector S. The remapping vector S 1002 in FIG. 10 thus interchanges the first and second rows of the original matrix E.

FIG. 11 illustrates a matching operation that represents a comparison operation used in method and system embodiments of the present invention. In the mapping operation, a particular codeword from the configuration matrix C is compared to a row of the defect matrix E, or the sorted defect matrix E, to determine whether or not the codeword is compatible with the positions of, and types of, defects along an addressed signal line represented by the row of the defect matrices E and T. A codeword is compatible with the positions and types of defects when no closed defect corresponds to Boolean digit "0" in the codeword and no open defect corresponds to the Boolean digit "1" in the codeword. In FIG. 11, the first codeword, or row, of the configuration matrix C (912 in FIG. 9) is compared to the first row in the sorted defect matrices E and T in order to determine whether or not the codeword is compatible with any defects in the first addressed signal line of the device represented by defect matrices E and T. The first row in the sorted matrix E 1102 and the corresponding first row in the matrix T 1104 are used in multiple operations. First, an open mask 1106 is computed as $E_1$ XOR $T_1$ 1108. The open mask contains a Boolean value "1" for each open defect along the addressed signal line represented by the first row in the defect matrices E and T. Similarly, a closed mask 1110 is computed as $E_1$ AND $T_1$ 1112. The closed mask contains the Boolean value "1" in each position corresponding to a closed defect along the signal line represented by the first row of the defect matrices E and T. The match operation 1120 between the first row of the defect matrices E and T and the first code, or row, in the configuration matrix C is computed as:

$$\text{match}(C_1, E_1, T_1) = [(\text{openMask}(E_1) \text{ AND } C_1) \text{ OR } (\text{closedMask}(E_1) \text{ AND NOT } C_1) == 0]$$

In other words, ANDing the open mask with the configuration matrix row $C_1$ and the closed mask with the complement of the first row of the configuration matrix and ORing the two results produces a bit vector with a Boolean value "1" at each position in which the codeword C1 is incompatible with the defects along the signal line represented by the first row in the defect matrices E and T. When the match operation produces an all-0 bit vector, then the codeword is compatible with the defects. In other words, despite the presence of any defects, the codeword, when output by the encoder, nonetheless uniquely selects the signal line containing the defects.

Figure 12:
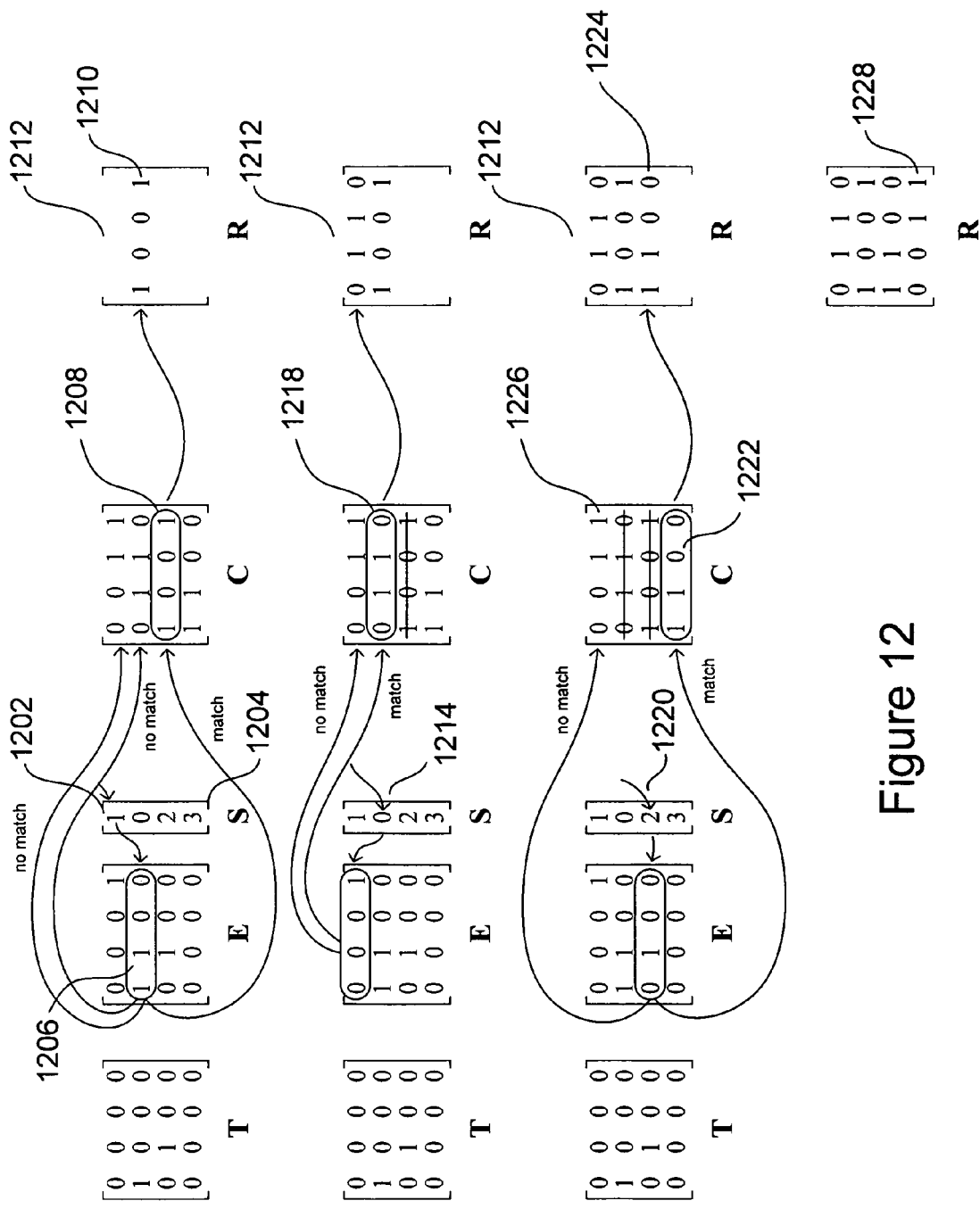
FIG. 12 illustrates calculation of a reconfiguration matrix R according to one embodiment of the present invention.

FIG. 12 illustrates calculation of a reconfiguration matrix R according to one embodiment of the present invention. In FIG. 12, the sorted defect matrix E, the defect matrix T, and the configuration matrix C shown in FIGS. 9-10 are used to produce a reconfiguration matrix R. Each row of the sorted defect matrices E and T are considered in each step of the iterative procedure. Note that the four rows are numbered from 0 to 3, in C and C++ programming convention. In the first step, the first row of the sorted defect matrices (the second row of the unsorted defect matrices, as indicated by the value "1" 1202 in the remapping vector S 1204) is considered. The first row is compared, in order, to each row of the configuration matrix by the match operation discussed with reference to FIG. 11. No match occurs when the row is compared to the first two rows of the configuration matrix, but when the first row of the sorted defect matrices 1206 is compared to the third row of the configuration matrix 1208, the match operation indicates that the codeword (1,0,0,1) is compatible with the defects indicated by the second row of the unsorted defect matrices E and T. Therefore, the codeword 1208 is placed in the second row 1210 of the reconfiguration matrix R 1212 to indicate that the second row of the unsorted defect matrices E and T, describing the defects along an addressed signal line, are compatible with the codeword (1,0,0,1). In a second step, the second row 1214 of the sorted defect matrices E and T is matched against the remaining rows of the configuration matrix C until it is determined that the second row of the sorted defect matrices matches the second row of the configuration matrix 1218. Therefore the second row of the configuration matrix 1218 is placed into the first row of the reconfiguration matrix 1212, since the second row of the sorted defect matrices E and T correspond to the first row of the unsorted defect matrices E and T. In a third step, the third row 1220 of the sorted defect matrices E and T is compared, in order, to the remaining codewords in the configuration matrix C until it is determined that this third row of the sorted E and T matrices matches the final row 1222 of the configuration matrix C. Therefore the final row, or codeword, in the configuration matrix C is entered as the third row 1224 of the reconfiguration matrix 1212. The final row of the sorted defect matrix E contains all "0" values. This indicates that there are no defects in this row. Therefore, any codeword remaining in the configuration matrix can be used to code for the signal line represented by this final row of assorted E and T defect matrices. The only remaining row in the configuration matrix is the first row 1226, which is then placed into the reconfiguration matrix as the final row of the reconfiguration matrix 1228.

To summarize, the defect matrices E and T are together sorted by the weight of the rows in the defect matrix E. This ensures that the signal lines with the most defective nanowire junctions are considered first. These signal lines can be considered to have the most defect-related constraints. By considering these signal lines first, when the maximum number of codewords is still available in the configuration matrix C, the likelihood of finding codewords compatible with the highly constrained, highly defective signal lines is greatest. Each row in the sorted defect matrices E and T is separately considered in successive iterations of the method that represents one embodiment of the present invention. For each row of the sorted defect matrices E and T, all available codewords not previously assigned to signal lines are considered until a codeword that matches the currently considered row of the sorted defect matrices E and T is found. That codeword is then inserted into the reconfiguration matrix R at the row corresponding to the row represented by the currently considered row of the unsorted defect matrices E and T. When the algorithm successfully completes by computing a reconfiguration matrix R, reconfiguration of the multiplexer according to the reconfiguration matrix R results in a properly operating demultiplexer, despite the detected defects represented by the defect matrices E and T.

Figure 13:
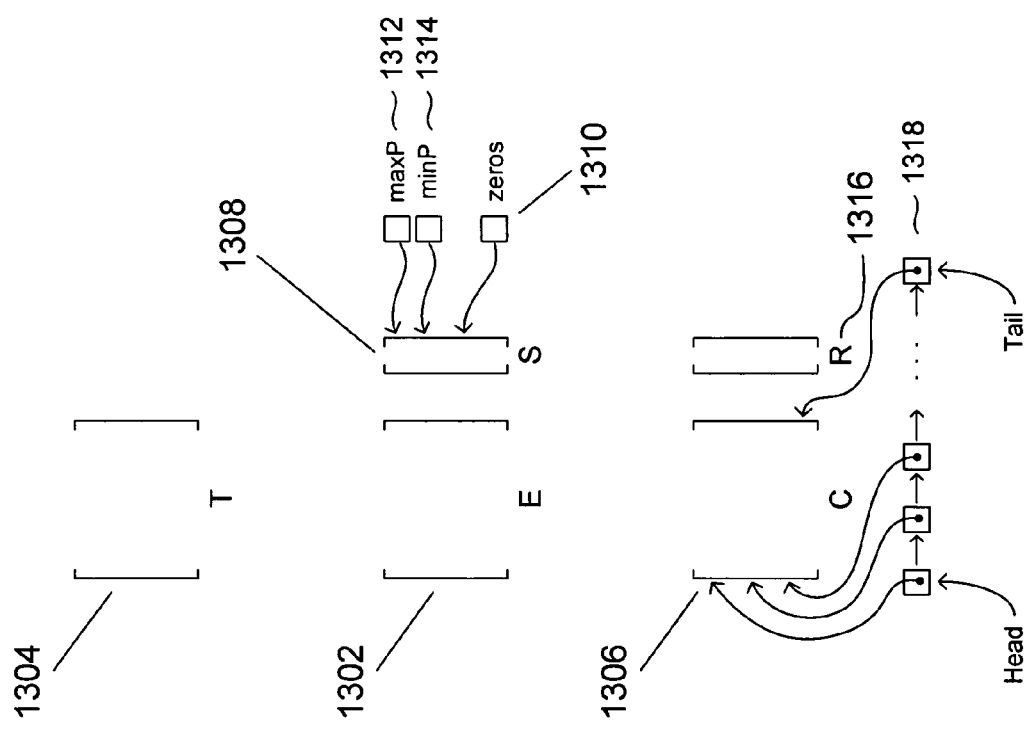
FIG. 13 illustrates data structures used by one method embodiment of the present invention.

FIG. 13 illustrates data structures used by one method embodiment of the present invention. The defect matrices E 1302 and T 1304, as well as the configuration matrix C 1306, are represented by two-dimensional binary matrices. The defect matrices E and T are sorted by a remapping vector S 1308 that indicates remapping of the rows of the unsorted, original defect matrices E and T to produce the sorted defect matrices E and T. The rows in the remapping vector S, are sorted, in descending order from the top, by the weights of the corresponding rows of the defect matrix E. In one embodiment of the present invention, it is useful to have a variable "zeros" that indicates the first entry in the remapping vector S 1308 corresponding to a defect matrix E row that contains only logic value "0" digits, or, in other words, the first 0-vector entry of the sorted defect matrix E. All entries in the remapping vector below this value are also 0 vectors, since the entries in the remapping vector S are sorted by weight. In one embodiment of the present invention, it is also useful to have two variables "maxP" and "minP" 1312 and 1314, respectively, that point to entries in the remapping vector S that bracket the highest weight run of two or more identical-weight rows of the sorted defect matrix E. In one embodiment of the present invention, rather than producing a two-dimensional reconfiguration matrix R, the matrix R is represented by a remapping vector R 1316 along with the original configuration matrix C 1306. Thus, for example, the first row of the reconfiguration matrix can be found by accessing the first entry in the remapping vector R 1316, which contains the index of the row in the original configuration matrix corresponding to the first row of the reconfiguration matrix. Finally, a linked list 1318 is employed to represent all of the rows, or codewords, of the configuration matrix C. When assigning codewords to the reconfiguration matrix, each codeword that is assigned is deleted from the linked list, so that only the remaining, available codewords need to be searched when searching for codewords compatible to subsequently considered sorted defect matrix rows.

Figure 14:
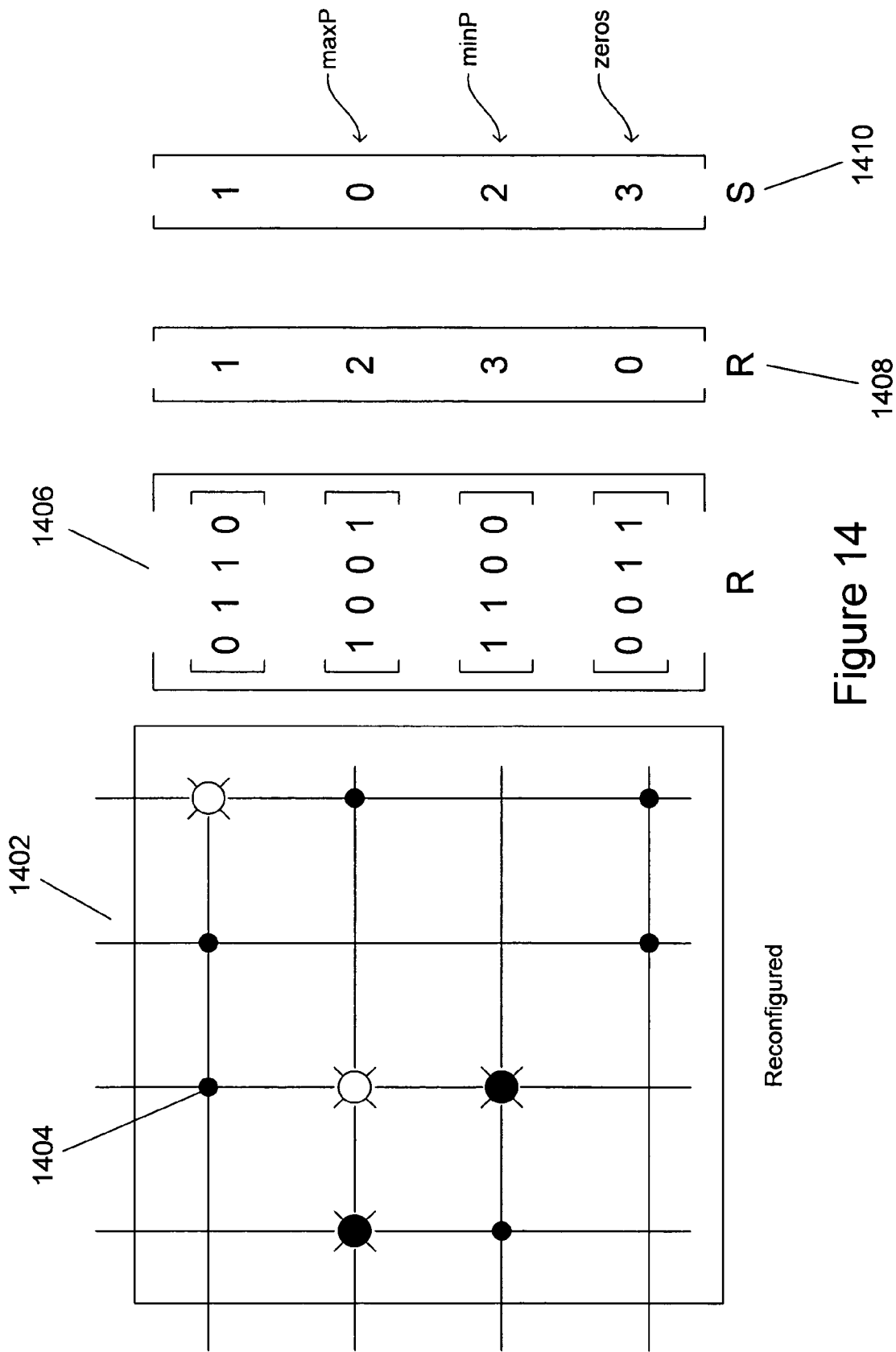
FIG. 14 shows the results of configuration of the defective crossbar, shown in FIG. 9, by a method embodiment of the present invention, as discussed with reference to FIGS. 10-13.

FIG. 14 shows the results of configuration of the defective crossbar, shown in FIG. 9, by a method embodiment of the present invention, as discussed with reference to FIGS. 10-13. In FIG. 14, the crossbar has been reconfigured according to the reconfiguration matrix R. The non-defective, closed-state junctions are represented in FIG. 14 by filled disks, such as filled disk 1404. For each addressed signal line of the defective, reconfigured crossbar 1402, the code compatible with that signal line and any defects in the signal line represented by the corresponding row of the reconfiguration matrix R is shown in a first column 1406 to the right of the defective crossbar 1402. The remapping vector R corresponding to the reconfiguration matrix R 1408 and the remapping vector S 1410, both discussed above with reference to FIGS. 11-13, are shown to the right of the codewords. Comparison of the two-dimensional reconfiguration matrix R 1406 to the original configuration matrix C (912 in FIG. 9) reveals that the rows of the original configuration matrix C have been permuted according to remapping vector R 1408 to produce the reconfiguration matrix R.

Figure 15:
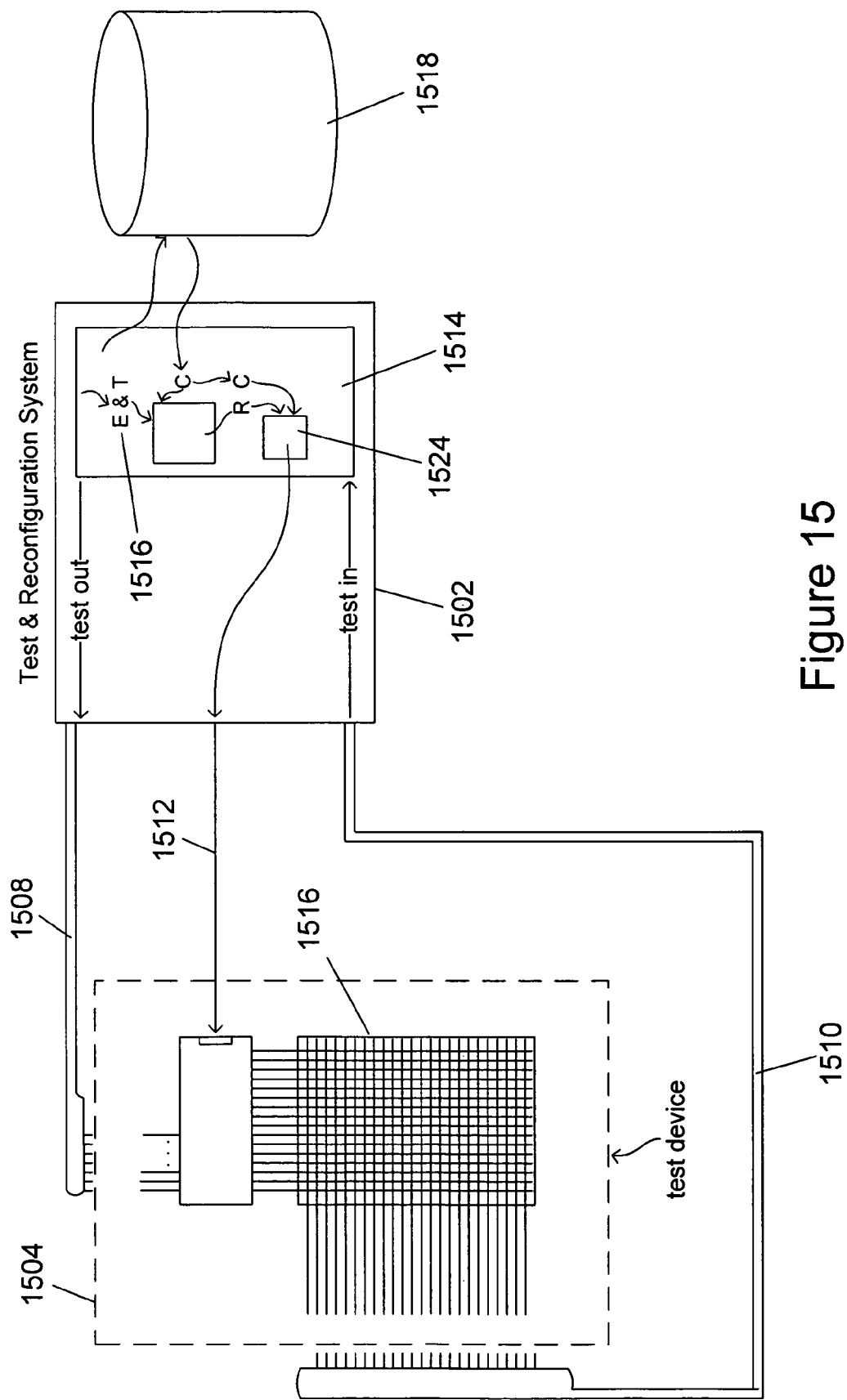
FIG. 15 illustrates a test and reconfiguration system that represents one embodiment of the present invention.

FIG. 15 illustrates a test and reconfiguration system that represents one embodiment of the present invention. According to the method and system embodiments of the present invention, as discussed above, following manufacture, electronic devices are tested individually to identify defects within the devices resulting from manufacturing, handling, storage, initial configuration, and from other sources of defects and damage. The identification of defects allows for the device to be configured or reconfigured so that the device correctly operates despite the presence of the detected defects. As discussed above, method and system embodiments of the present invention employ permutation of an original configuration matrix, or, in other words, a permutation of the codewords of a code that represent the configuration of the device in order to produce a reconfiguration, or permutation of the configuration matrix, that reassigns codes to device components so that defects detected within the device are masked, or ameliorated, by the reconfiguration. In the case of a nanoscale demultiplexer, described above, the reconfiguration matrix may used to initially configure a defective nanowire crossbar within the demultiplexer, and the encoder of the demultiplexer, so that all addressed signal lines can be selected by appropriate external addresses. Alternatively, when defects can be identified prior to when the demultiplexer is initially configured, the demultiplexer may be initially configured using the reconfiguration matrix. The phrase "reconfiguration matrix" is used to indicate that the reconfiguration matrix is a permutation of the original configuration matrix, and does not necessarily imply that a device needs to be reconfigured. However, in many cases, a device must be initially configured to allow for testing that reveals defects, and thus actually needs to be reconfigured according to a computed reconfiguration matrix when defects are identified.

It should be pointed out that permutation of the initial configuration may be employed in addition to reliance on built-in redundancy in order to ameliorate defects. For example, as discussed above, the internal codewords that together comprise the configuration matrix C may have lengths, in bits, greater than the number of bits required to uniquely associate each codeword with an addressed signal line or other feature. For example, consider the simple demultiplexer of FIGS. 3A-5. In that demultiplexer, a two-bit address is used to select each of four addressed nanowire signal lines. The implementations shown in FIGS. 4 and 5 employ an encoder that transforms the input, two-bit internal address into a four-bit internal codeword that, when input into the demultiplexer crossbar, results in a single addressed nanowire signal line raised to a logic "1" state, while the remaining addressed signal lines are in the logic "0" state. In an alternative implementation, two-bit input external addresses may be transformed into six-bit, eight-bit, or codewords of even greater length, with six, eight or a greater number of signal lines output by the encoder to a wider crossbar. With the internal codes correctly computed to furnish a largest possible minimum distance between codewords of the code, the wider crossbar can tolerate a number of defects without reconfiguration, because the remaining, non-defective junctions may still provide sufficient basis for unambiguous selection of addressed signal lines. Even with increased redundancy, however, there are failure patterns that can nonetheless result in a non-operational device, just as there are defect patterns for which a reconfiguration matrix R cannot be found, by methods of the present invention. A subset of the possible failure patterns that cannot be overcome by designed redundancy may be ameliorated by permutation of the configuration matrix for the wider crossbar. Thus, a combination of design redundancy and reconfiguration may together ameliorate a greater number of possible defect patterns than can be ameliorated by design redundancy alone or by reconfiguration alone. Thus, the configuration-matrix-permutation method of the present invention may be employed alone, or in combination with designed redundancy, in order to ameliorate defects in manufactured electronic devices.

In FIG. 15, a test and reconfiguration system 1502 is used to test each manufactured device 1504 and to reconfigure the device, when necessary, in order to ameliorate detected defects. In FIG. 15, the device to be tested is shown to include a nanoscale demultiplexer 1506. The test and reconfiguration system includes a test-out connect 1508 and a test-in connect 1510, in addition to a configuration output 1512. The test system includes one or more software programs and/or logic circuits and other components 1514 that output a series of addresses through the test-out connect 1508 to the device being tested 1504 and read the output produced by input of each address from the device through the test-in connect 1510. By comparing the output read from the device to an expected output, based on the configuration matrix C for the device, the test and reconfiguration system can determine the type and positions of defective junctions within the nanoscale crossbar, and can encode those defects in the above-discussed E and T defect matrices 1516. Although, in FIG. 15, the test-in connection is shown connected to each of the addressed nanowire signal lines emanating from the demultiplexer crossbar, in practical applications, rather than directly connecting to nanoscale features, the test-in connect generally connects to submicroscale or microscale outputs of the device, and reads output signals from the device to infer the logic states of the addressed nanoscale signal lines. The inference process may be more or less direct, or it may require significant analysis and extensive testing. The results of testing produces the E and T defect matrices, discussed above, which abstractly represent the positions and types of the detected defects. The configuration matrix C for the device can be either read from the device or obtained from a database 1518 using a serial number or identifier read from the device to look up the configuration matrix for the device from the database. The E, T, and C matrices then serve as input to a reconfiguration module that, as discussed above, produces a reconfiguration matrix R or, alternatively, a reconfiguration remapping vector R that, along with the original configuration matrix C, comprises the reconfiguration matrix R. The reconfiguration matrix is then input into a reconfiguration module 1524 that reconfigures the tested device via the configuration output 1512. As discussed above, device configuration or reconfiguration generally comprises loading a codeword table in an encoder that uses the codeword table, or lookup table, for translating input external addresses into internal codewords, and configuring or reconfiguring the nanowire crossbar by applying configuration voltages and/or currents to appropriate nanowire junctions.

Figure 16:
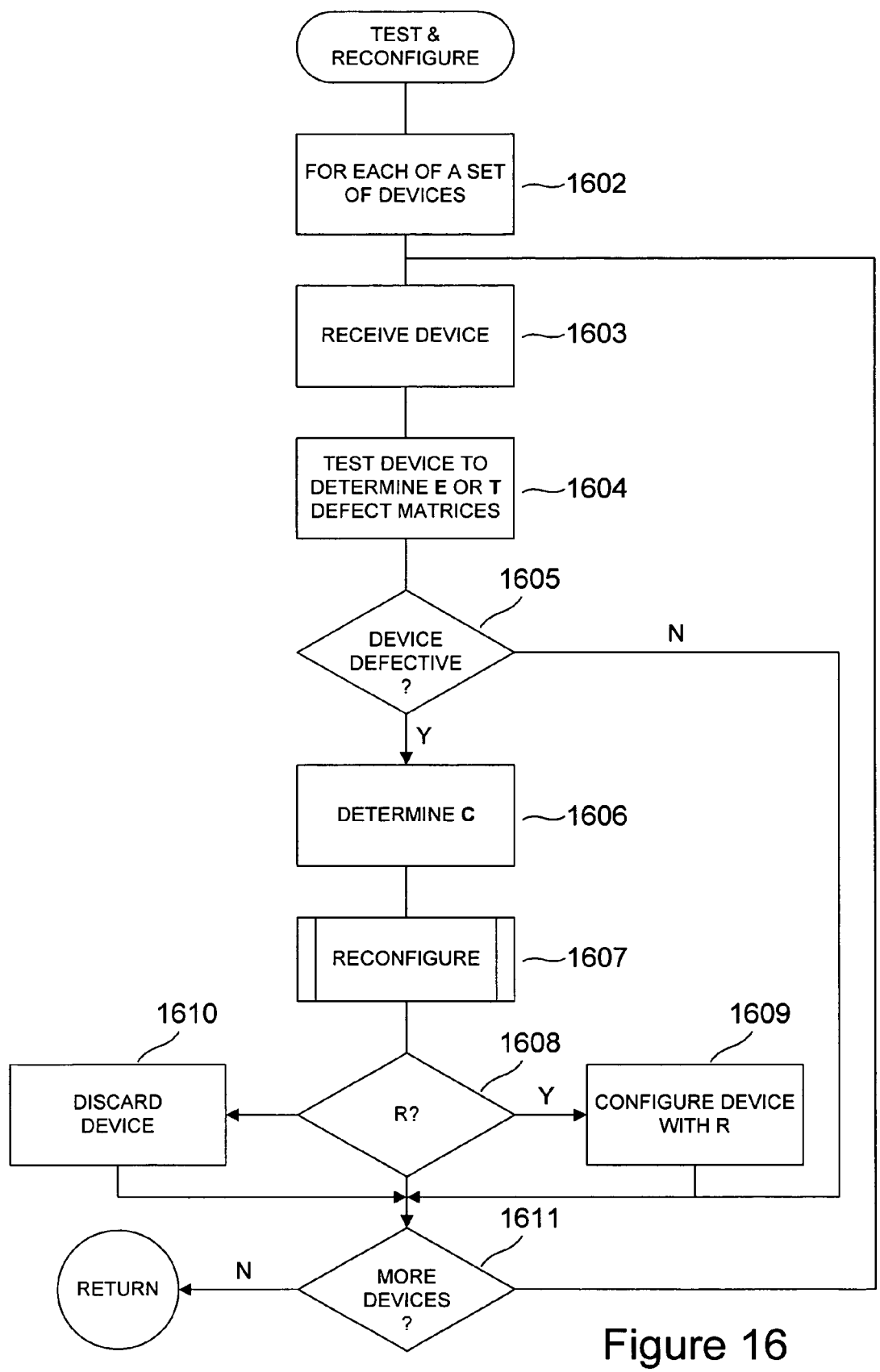
FIGS. 16-17 provide control-flow diagrams that illustrate one embodiment of the present invention.
Figure 17:
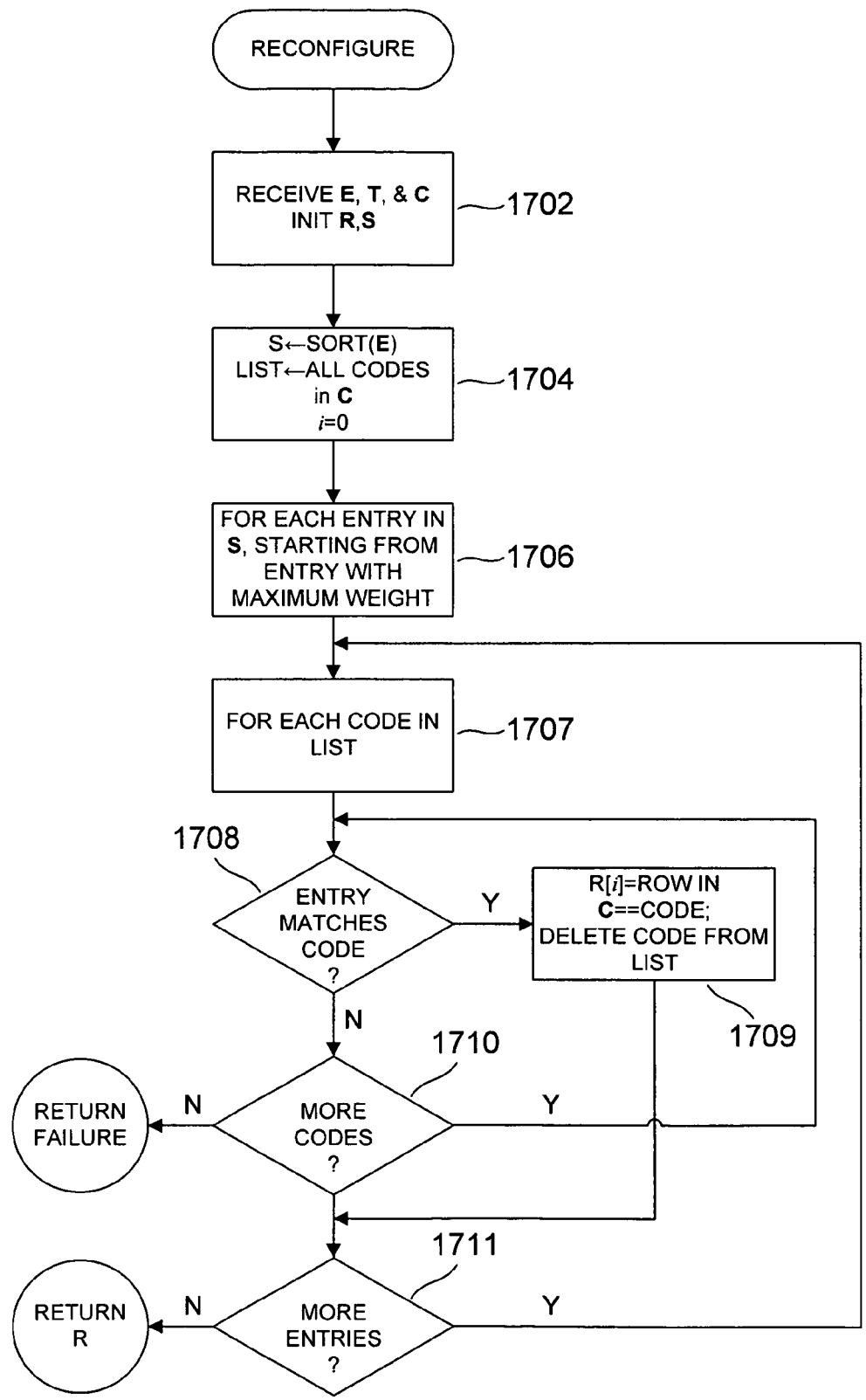

FIGS. 16-17 provide control-flow diagrams that illustrate one embodiment of the present invention. FIG. 16 shows a control-flow diagram for the method "test and reconfigure." In the for-loop of steps 1602-1611, a set of devices are tested and, when necessary, reconfigured in order to ameliorate detected defects, or discarded, when amelioration of defects is not possible. For each device, the device is received by the test and reconfiguration system in step 1603. The received device is connected to the test and reconfiguration system, as shown, in one example, in FIG. 15. In step 1604, the test and reconfiguration system applies signals to the devices and reads signals output from the devices in order to identify defective nanowire junctions or other defective features and components within the device. If the device does not contain defects, as determined in step 1605, then no further processing is necessary with respect to the device. Otherwise, in step 1606, the test and reconfiguration method determines the initial configuration matrix C, discussed above. The configuration matrix for the device may, in certain cases, be directly read from the device. In more general cases, the configuration matrix C can be obtained from a database of configuration matrices by using an identifier or serial number electronically stored in the device and read from the device to identify and retrieve the appropriate configuration matrix from a database. In yet additional embodiments of the present invention, the configuration matrix C may be hard coded in software programs or logic circuits within the test and reconfiguration system. In step 1607, a reconfiguration method of the present invention is carried out to produce a reconfiguration matrix R. If a reconfiguration matrix R is successfully computed, by permutation of the configuration matrix C, as determined in step 1608, then, in step 1609, the device is configured or reconfigured according to the reconfiguration matrix R. The configured or reconfigured device can then be output to a device-manufacturing output stream. In the case that a reconfiguration matrix cannot be computed, as determined in step 1607, the device is, in one embodiment of the present invention, discarded in step 1610. As discussed above, there are various types and patterns of defect occurrence within a device that cannot be ameliorated by permuting the configuration matrix C. The for-loop of steps 1602-1611 iterates until all devices are tested and either reconfigured or discarded.

FIG. 17 is a control-flow diagram for the method "reconfigure" called in step 1606 of the method "test and reconfigure" diagrammed in FIG. 16. In step 1702, the defect matrices E and T and the configuration matrix C are received, and the remapping vectors S and R, discussed above with reference to FIGS. 12 and 13, are initialized. In step 1704, the defect matrices E and T are sorted, by the weight of the rows of defect matrix E, to produce a remapping vector S that, in combination with the original matrices E and T, comprises sorted defect matrices E and T. The remapping vector represents a sorting in descending order by weight. Also in step 1704, a linked list representing available codewords is prepared based on codewords contained in the configuration matrix C. Finally, variable i is initialized to zero. Next, in the for-loop of steps 1706-1711, each entry in the sorted defect matrices E and T, represented by an entry in the remapping vector S, is considered, from the entries representing the maximum-weight entries of the defect matrices to the lowest-weight entries. A codeword for each of the considered entries of the remapping vector S is found in the inner for-loop of steps 1707-1710. In the inner for-loop, all of the available codewords in the list of codewords are considered until a codeword that matches the currently considered entry in the sorted defect matrices E and T is found, using the match operation discussed with reference to FIG. 11. If a compatible codeword for the currently considered defective-matrices row is found, as determined in step 1708, then an entry is inserted into the remapping vector R to represent the assignment of the codeword to the position of the currently considered entry in the unsorted defect matrices E and T. In other words, if the remapping-vector entry R[0] contains the integer 5, then the sixth codeword in the original configuration matrix C is mapped to the first row of the reconfiguration matrix R. When a compatible codeword is found for the currently considered defect-matrix entry, assigned in step 1709, control flows out of the inner loop to step 1711 of the outer loop. If no compatible code can be found for the currently considered defect-matrix entry, as determined in step 1710, then the permutation of configuration matrix C to produce a reconfiguration matrix R fails, and a failure is returned. The outer for-loop of steps 1707-1711 continues until all rows of the defect matrices E and T have been assigned codes to produce a complete reconfiguration matrix R or, equivalently, a complete reconfiguration remapping vector R that, together with the original configuration matrix C, comprises a reconfiguration matrix R.

A number of improvements of the general reconfiguration method, shown in FIG. 17, are possible. In one improvement, matching is carried out for all non-zero weight defect-matrix entries, but once all of the non-zero weight entries are assigned codewords, any remaining entries can be arbitrarily assigned codewords from the remaining codewords in the list without regard to compatibility, since the zero-weight defect-matrix entries indicate no defects, and therefore any of the remaining codewords suitable for non-defective addressed lines or other features. A second improvement involves carrying out a slightly more exhaustive search for a reconfiguration matrix. In this slightly more exhaustive search, referring back to FIG. 13, should a first attempt at permuting the configuration matrix C fail, additional attempts may be made by changing the starting point for considering entries in the sorted defect matrices E and T for the set of consecutive entries bounded by the indexes stored in the maxP and minP variables. As discussed above, the maxP and minP variables indicate the highest-weight set of consecutive, identical, and non-zero-weight entries within the sorted defect matrices E and T. By altering which of these entries is first considered in the search for a reconfiguration matrix R, a larger space of possible permutations of the configuration matrix C may be searched. This is a compromise approach that searches a greater number of possible permutations than the approach diagrammed in FIG. 17, but that does not carry out an exhaustive search of all possible permutations, which is, in general, computationally infeasible. Additional alternatives and improvements are possible, particularly when more information about the types and frequency of occurrences of defects within the devices to be tested are known.

It should be noted that, although the examples discussed in the current application are demultiplexers, in particular nanoscale demultiplexers, described by configuration matrices describing the pattern of open-state and closed-state crossbar connections, the method and system embodiments of the present invention can be more generally applied to any type of configurable electronic device, the configuration of which can be expressed by a configuration matrix, or table of internal codewords. Examples include the AND-plane or OR-plane of a programmable logic array. While binary codewords are preferable, alternative embodiments of the present invention may operate on codewords, each element of which is expressed in digits of an arbitrary base. For example, features or components of a device may have four, rather than two, configuration states, in which case the digits of the configuration matrix may be base-four digits selected from the digits {0,1,2,3}. In alternative embodiments of the present invention, the defect matrices may also contain non-binary digits or values, when more than two types of defects are possible. For example, when three different types of defects are possible, rather than using two defect matrices E and T, a single defect matrix E with base-four elements can be used, with three of the possible base-four-element values each indicating one of the three types of defects, and one value indicating a non-defective component or feature, or three binary matrices $T_1$, $T_2$, and $T_3$ could be used. By the same token, when only a single type of defect can occur, a single binary defect matrix E can be used. Of course, with all of these variants, different matching and comparison functions need to be used to match codewords to those in the defect matrix or matrices. As should be obvious to anyone familiar with computer science, computer hardware, and/or electrical engineering, the methods of the present invention can be applied to arbitrarily large demultiplexers with associated configuration matrices that have an arbitrarily large number or rows and codewords of arbitrarily large length. Furthermore, many different types of configurable devices, and defects within such devices, can be modeled by configuration matrices and defect matrices, and are thus amenable to reconfiguration according to embodiments of the present invention.

C++ Implementation of One Embodiment of the Reconfiguration Method of the Present Invention In this subsection, a C++ implementation of a reconfiguration routine that represents one embodiment of the present invention is provided. This C++ implementation is intended to illustrate one practical approach to implementing a reconfiguration routine as well as certain of the many possible considerations, trade-offs, and balances involved in the implementation. It is not, however, intended to represent the only possible approach, or even an optimal approach.

First, a number of standard C++ libraries are included:

```
1 #include <stdio.h>
2 #include <math.h>
3 #include <stdlib.h>
4 #include <search.h>
```

Then, a number of constants are declared:

```
1 const int BITS_PER_INT = 32;
2 const int MAX_BIT_LENGTH = 512;
3 const int MAX_WORD_LENGTH = MAX_BIT_LENGTH / BITS_PER_INT;
4 const int MAX_ROWS = 512;
5 const int null = 0;
6 const int NUM_MASKS = BITS_PER_INT + 1;
```

The constant BITS_PER_INT defines the length, in bits, of a variable of type "int." The constant MAX_BIT_LENGTH defines the maximum lengths for the rows of the C, T, and E matrices. The constant MAX_WORD_LENGTH defines the maximum row length in integers. The constant MAX_ROWS defines the maximum number of rows for the matrices C, T, and E. The constant "null" defines a return value generally used to indicate failure for functions that return pointers. The constant NUM_MASKS defines the number of bit masks in an array of bit masks used to implement Boolean operations on matrix rows. These constants can be altered to accommodate larger or smaller configuration matrices.

Next, the structures "listE" and "sElement" structures are declared:

```
1 typedef struct liste {
2     int row;
3     int ptr;
```

```
4 } listE;
1 typedef struct selemnt {
2     int row;
3     int weight;
4 } sElement;
```

Instances of the structure "listE" are used as elements of a linked list of available codes. Instances of the structure "sElement" are used for the elements of the S remapping vector.

Next, a comparison function is declared:

```
1 int compare( const void *arg1, const void *arg2)
2 {
3     if (((sElement*)arg1)->weight < ((sElement*)arg2)->weight) return 1;
4     else if (((sElement*)arg1)->weight > ((sElement*)arg2)->weight) return -1;
5     else if (((sElement*)arg1)->row > ((sElement*)arg2)->row) return 1;
6     else if (((sElement*)arg1)->row < ((sElement*)arg2)->row) return -1;
7     else return 0;
8 }
```

This comparison function is used, by a standard quick-sort routine, to sort the elements of the S remapping vector.

A declaration of the class "BoolArray" is next provided:

```
1  class BoolArray
2  {
3      private:
4          int data[MAX_WORD_LENGTH];
5          int size;
6          int wSize;
7          bool even;
8          int numBitsInLastWord;
9          static bool masks;
10         static int positivePMasks[NUM_MASKS];
11         static int bitMasks[NUM_MASKS];
12
13     public:
14         int* getField(int i) {if (i >= 0 && i < size) return &(data[i]);
15                              else return null;};
16         void setField(int f, int i) {if (i >= 0 && i < size)
                                         data[i] = f;};
17         int getSize( ) {return size;};
18         int getWsize( ) {return wSize;};
19
20         int weight ( );
21         void init(int n);
22         bool zero( );
23         void AND(BoolArray* op1, BoolArray* op2);
24         void OR(BoolArray* op1, BoolArray* op2);
25         void NOT(BoolArray* op1);
26         void XOR(BoolArray* op1, BoolArray* op2);
27         void set(int index);
28         void set(int* indices);
29         bool get(int index);
30         BoolArray( );
31 };
32 bool BoolArray::masks = false;
33 int BoolArray::positivePMasks[NUM_MASKS];
34 int BoolArray::bitMasks[NUM_MASKS];
```

Instances of the class "BoolArray" are rows of the matrices C, E, and T, and are essentially long bit vectors that cannot be stored within single instances of integer and long data types. The bit vectors are stored in the private data member "data," declared on line 4, above. The size, in bits, of the bit vector is stored in the private data member "size," declared on line 5. The size, in integers, is stored in the private data member "Wsize," declared on line 6. If the bit vector is of a length that is an even multiple of the number of bits in a variable of type "int," then the private data member "even," declared on line 7, is set to TRUE. Otherwise, the data member "even" is set to FALSE. The private data member "numBitsInLastWord," declared on line 8, indicates the number of bits in the last integer of the sequence of integers in which the bit vector is stored. The three static data members declared on lines 9-11 are used to initialize and store a number of bit masks useful in computing results of Boolean operations on instances of the class "BoolArray." The bit masks stored in the array "positivePMasks," declared on line 10, start with a zero integer and then include masks with increasing numbers of "1" bits, from lowest significant bit to highest significant bit. The array "bitMasks," declared on line 11, includes all possible single-bit bit masks that can be stored in an integer.

The class "BoolArray" includes a number of public function members. Individual integers in which the bit vector represented by an instance of the class "BoolArray" is stored are referred to as fields. The function members "getField" and "setField," declared on lines 14-16, retrieve individual integers and set the value of individual integers within the data array "data" that stores the vector. The function members "getSize" and "getWsize," declared on lines 17-18, return the size in bits and the size in integers fields, respectively, of the bit vector represented by an instance of the class "BoolArray." The function member "init," declared on line 21, initializes an instance of the class "BoolArray." The function member "zero" returns a Boolean value indicating whether or not the bit vector represented by an instance of the class "BoolArray" is a zero vector. The function members "AND," "OR," "NOT," and "XOR," declared on lines 23-26, implement the bitwise logic operators AND, OR, NOT, and XOR. In general, the result of the bitwise logic operation is stored in the current instance of the class "BoolArray." The result is computed from one or two other instances of the class "BoolArray" supplied as arguments. The function members "set," "set," and "get," declared on lines 27-29, allow individual bits in the bit vector to be set and retrieved. Finally, a constructor is declared on line 30.

A declaration for the class "BoolMatrix" is provided:

```
1  class BoolMatrix
2  {
3      private:
4          BoolArray* data[MAX_ROWS];
5          int numRows;
6
7      public:
8          BoolArray* get(int row);
9          bool set(int row, BoolArray* r);
10         int getSize( ) {return numRows;};
11         BoolMatrix( );
12 };
```

An instance of the class "BoolMatrix" represents one of the matrices E, T, and C, discussed above. The private data member "data" is an array of pointers to instances of the class "BoolArray." The private data member "numRows," declared on line 5, indicates the number of rows in the matrix. The function members "get," "set," and "getSize," declared on lines 8-10, call for retrieving and setting rows of the matrix and for retrieving the size of the matrix, respectively. A constructor is declared on line 11.

The class "availableCodes" is declared as follows:

```
1  class availableCodes
2  {
3    private:
4      listE data[MAX_ROWS + 2];
5      int nxt;
6      int beforeNxt;
7      int list;
8      int numRemaining;
9      BoolMatrix* c;
10
``` to the first code in the linked list. The data member "numRemaining," declared on line 8, contains the number of codes remaining in the linked list. The data member "c," declared on line 9, is a pointer to the configuration matrix C. The function members "first" and "next," declared on lines 12-13, reset the current element pointer to the first element in the linked list and advance the current element pointer, respectively. The function member "deleteCurrent," declared on line 14, deletes the current element from the linked list. The function member "getCurrent," declared on line 5, returns the row number of the current code, where the row number is the index of the row in configuration matrix C. The function member "init," declared on line 16, initialized the linked list to include an element for each row in the configuration matrix C. A constructor for the class "availableCodes," is provided on line 17.

A final class declaration is for the class "reconfigure," provided next:

```
1  class reconfigure
2  {
3    private:
4      int R[MAX_ROWS];
5      BoolMatrix* C;
6      BoolMatrix* E;
7      BoolMatrix* T;
8      sElement S[MAX_ROWS];
9
10     availableCodes codes;
11     int rowSize;
12     int colSize;
13     int minP, maxP;
14     int cycle;
15     int zeros;
16     bool copy(int& j);
17
18     BoolArray openMask;
19     BoolArray closedMask;
20     BoolArray or1;
21     BoolArray or2;
22     BoolArray not;
23     BoolArray res;
24
25     void sortE( );
26     bool match(int Eindex, int Cindex);
27     bool check (BoolMatrix* c, BoolMatrix* e, BoolMatrix* t);
28
29   public:
30     int* reconfigureC (BoolMatrix* c, BoolMatrix* e, BoolMatrix* t);
31     reconfigure( );
32  };
```

-continued

```
11   public:
12     bool first( );
13     bool next( );
14     void deleteCurrent( );
15     int getCurrent( );
16     void init(BoolMatrix* C);
17     availableCodes( );
18  };
```

An instance of the class "availableCodes" is a linked list of "listE" structures. The structures are contained in the private data member "data," declared on line 4. The data members "next" and "beforeNext," declared on lines 5 and 6, are pointers that point to a current code in the linked list and the preceding code in the linked list, and are used to traverse the linked list. The data member "list," declared on line 7, points The C, E, and T matrices, and the S and R remapping vectors, are declared on lines 4-8. The linked list of available codewords is declared on line 10. The "minP" and "maxP" variables, discussed above, are declared on line 13. The data members "rowSize" and "callSize," declared on lines 11-12, contain the row size and column size of the C, E, and T matrices. In the current implementation of the reconfiguration method, the C, E, and T matrices must have the same number of rows and columns. In alternative embodiments, it is possible that the C matrix may have larger dimensions than either of the E and T matrices. The data member "cycle," declared on line 14, indicates the number of sorted E matrix rows bounded by the indices stored in the "minP" and "maxP" variables. The data member "zero," declared on line 15, points to the index the first zero vector in the sorted E and T matrices. The private function member "copy," declared on line 16, is used to copy excessive remaining codewords into the R remapping vector for all remaining zero-vector entries in the sorted E matrix. The instances of the class "BoolArray" declared on lines 18-23 store intermediate values computed in the mask operation, discussed above with reference to FIG. 11. The function member "sortE," declared on line 25, sorts the E matrix by row weight. The function member "match," declared on line 26, implements the match operation discussed above with reference to FIG. 11. The function member "check," declared on line 27, carries out preliminary checking and validation of supplied C, E, and T matrices. The single public function member "reconfigureC," declared on line 30, computes a reconfiguration mapping vector R from supplied C, E, and T matrices. Finally, a constructor is declared on line 31.

Implementation of the function members of the class "availableCodes" are next provided:

```
 1 bool availableCodes::first( )
 2 {
 3     if (!numRemaining) return false;
 4     nxt = list;
 5     beforeNxt = MAX_ROWS + 1;
 6     data[beforeNxt].ptr = nxt;
 7     data[beforeNxt].row = -1;
 8     return true;
 9 }
 1 bool availableCodes::next( )
 2 {
 3     int* p;
 4
 5     if (!numRemaining) return false;
 6     p = &(data[nxt].ptr);
 7     if (*p < 0) return false;
 8     else
 9     {
10         beforeNxt = nxt;
11         nxt = *p;
12         return true;
13     }
14 }
 1 int availableCodes::getCurrent( )
 2 {
 3     if (!numRemaining) return null;
 4     return (data[nxt].row);
 5 }
 1 void availableCodes::deleteCurrent( )
 2 {
 3     int p;
 4
 5     if (!numRemaining) return;
 6     if (! --numRemaining) return;
 7     p = data[nxt].ptr;
 8     data[beforeNxt].ptr = p;
 9     if (list == nxt) list = p;
10     nxt = p;
11 }
 1 void availableCodes::init(BoolMatrix* C)
 2 {
 3     int m;
 4     int i;
 5
 6     c = C;
 7     m = c->getSize( );
 8     for (i = 0; i < m; i++)
 9     {
10         data[i].row = i;
11         data[i].ptr = i + 1;
12     }
13     data[m-1].ptr = -1;
14     nxt = 0;
15     list = 0;
16     beforeNxt = MAX_ROWS + 1;
17     data[beforeNxt].ptr = 0;
18     numRemaining = m;
19 }
 1 availableCodes::availableCodes( )
 2 {
 3     numRemaining = 0;
 4 }
```

The implementation is a straightforward linked list implementation. For example, to reset a list for traversal, the function member "first" sets the index "nxt" to equal the index stored in the variable "list," which references the first element in the list and initializes the index "beforeNxt" to reference a dummy list entry, which is initialized to reference the entry referenced by the variable "next." The function member "next," used to advance the traversal pointers, advances both pointer "nxt" and "beforeNxt." The function members for deleting the current element advance the next pointer and update the "beforeNxt" pointer, removing the current element from the list. The function member "getcurrent" simply returns the row stored in the element referenced by the pointer "nxt." Finally, the function member "init" initializes the linked list to contain the same number of elements as rows in the configuration matrix C, with each entry storing the row number of a different row in the configuration matrix C.

Next, implementations of the function members for the class "BoolArray" are provided:

```
 1 void BoolArray::init (int n)
 2 {
 3     int i;
 4
 5     if (n > MAX_BIT_LENGTH) n = MAX_BIT_LENGTH;
 6     if (n < 1) n = 32;
 7     size = n;
 8     wSize = n / BITS_PER_INT;
 9     numBitsInLastWord = n % BITS_PER_INT;
10     if (numBitsInLastWord)
11     {
12         wSize++;
13         even = false;
14     }
15     else even = true;
16     for (i = 0; i < wSize; i++)
17         data[i] = 0;
18 }
 1 int BoolArray::weight ( )
 2 {
 3     int i, j;
 4     int d;
 5     int w = 0;
 6
 7     for (i = 0; i < wSize; i++)
 8     {
 9         d = data[i];
10         for (j = 0; j < BITS_PER_INT; j++)
11         {
12             w += d & 1;
13             d = d >> 1;
14         }
15     }
16     return w;
17 }
 1 bool BoolArray::zero ( )
 2 {
 3     int i;
 4
 5     for (i = 0; i < wSize; i++)
 6         if (data[i])
 7             return false;
 8     return true;
 9 }
 1 void BoolArray::AND (BoolArray* op1, BoolArray* op2)
 2 {
```

```
                                         -continued
 3    int i;
 4
 5    for (i = 0; i < wSize; i++)
 6       setField(*op1->getField(i) & *op2->getField(i), i);
 7 }
 1 void BootArray::OR (BoolArray* op1, BoolArray* op2)
 2 {
 3    int i;
 4
 5    for (i = 0; i < wSize; i++)
 6       setField(*op1->getField(i) | *op2->getField(i), i);
 7 }
 1 void BoolArray::NOT (BoolArray* op1)
 2 {
 3    int i;
 4    int j = (even) ? wSize : wSize-1;
 5    int o1;
 6
 7    for (i = 0; i < j; i++)
 8       setField(~(*op1->getField(i)), i);
 9    if(!even)
10    {
11       o1 = ~(*op1->getField(j));
12       setField(o1 & positivePMasks[numBitsInLastWord], i);
13    }
14 }
 1 void BoolArray::XOR (BoolArray* op1, BoolArray* op2)
 2 {
 3    int i;
 4
 5    for (i = 0; i < wSize; i++)
 6       setField(*op1->getField(i) ^ *op2->getField(i), i);
 7 }
 1 void BoolArray::set (int index)
 2 {
 3    if (index >= size) return;
 4    int w = index / BITS_PER_INT;
 5    int offset = index % BITS_PER_INT;
 6    data[w] = data[w] | bitMasks[offset];
 7 }
 1 void BoolArray::set (int* indices)
 2 {
 3    while (*indices >= 0)
 4       set(*indices++);
 5 }
 1 bool BoolArray::get(int index)
 2 {
 3    int w = index / BITS_PER_INT;
 4    int offset = index % BITS_PER_INT;
 5    if (data[w] | bitMasks[offset]) return true;
 6    else return false;
 7 }
 1 BoolArray::BoolArray( )
 2 {
 3    int i = 0;
 4    int l;
 5
 6    if (!masks)
 7    {
 8       positivePMasks[0] = 0;
 9       bitMasks[0] = 1;
10       for (i = 1; i < BITS_PER_INT; i++)
11       {
12          I = i - 1;
13          positivePMasks[i] = (positivePMasks[I] << 1) | 1;
14          bitMasks[i] = bitMasks[I] << 1;
15       }
16       masks = true;
17    }
18    size = 0;
19    wSize = 0;
20 }
```

Again, as discussed above, the bits of the bit vector represented by an instance of the class "BoolArray" are stored in one or more successive integers in the array of integers "data." The bitwise logical operations therefore must carry out bitwise arithmetic operations on each of these integers, as well as on any final bits within the last integer that do not completely fill the integer. The function member "weight" simply counts the number of bits with value "1" in the bit vector using an arithmetic shift operation within a for-loop carried out on each integer that stores bits of a bit vector. Otherwise, the above implementations are straightforward, and not further discussed.

Implementations of the function members of the class "BoolMatrix" are next provided:

```
 1 bool BoolMatrix::set(int row, BoolArray* r)
 2 {
 3    if (row != numRows) return false;
 4    else
 5    {
 6       if (row != 0 && (r->getSize( ) != data[0]->getSize( )))
              return false;
 7       data[row] = r;
 8       numRows++;
 9       return true;
10    }
11 }
 1 BoolArray* BoolMatrix::get(int row)
 2 {
 3    if (row < 0 || row >= numRows) return null;
 4    else return data[row];
 5 }
 1 BoolMatrix::BoolMatrix( )
 2 {
 3    numRows = 0;
 4 }
```

These implementation are entirely straightforward and not further discussed.

Next, an implementation of the function member "sortE" of the class "reconfigure" is provided:

```
 1 void reconfigure::sortE( )
 2 {
 3    int i;
 4    int w;
 5    bool found = false;
 6
 7    for (i = 0; i < colSize; i++)
 8    {
 9       S[i].row = i;
10       S[i].weight = E->get(i)->weight( );
11    }
12
13    qsort( &(S[0]), E->getSize( ), 8, compare);
14    w = S[0].weight;
15    minP = 0;
16    maxP = 0;
17    for (i = 0; i < colSize; i++)
18    {
19       if (!found && (S[i].weight < w))
20       {
21          minP = i - 1;
22          if (minP - maxP > 0) found = true;
23          else maxP = i;
24       }
25       if (S[i].weight == 0)
26       {
27          zeros = i;
28          break;
29       }
30    }
31    if (minP - maxP <= 0)
32    {
33       maxP = 0;
34       minP = 1;
35       cycle = 0;
```

```
36    }
37    else cycle = minP − maxP + 1;
38 }
```

On lines 7-11, the remapping vector S is initialized to contain indexes into the defect matrix E paired with the computed weights for the indexed rows of the defective matrix E. On line 13, a library quick-sort function is called to sort the mapping vector S in descending weight order. In the for-loop of lines 17-30, the values for the variables "minP," "maxP," and "zero," described above with reference to FIG. 13, are set. Again, this involves searching the remapping vector S to find the highest weight, identical, and non-zero-weight rows of the sorted defective matrix E with two or more members. The starting point for searching for compatible codes in each iteration of an outer for-loop is varied within this group, in order to more exhaustively search the C-matrix-permutation space for a suitable reconfiguration matrix R. This code can be omitted should a more exhaustive search not be desired. If a suitable set of non-zero, identical-weight rows of the sorted defective matrix E cannot be found, the variables are set to default values on lines 31-36. Variable "cycle" is set to equal the number of identical-weight, non-zero-weight vectors in the group identified by indexes stored in the variables "minP," and "maxP."

An implementation of the function member "match" of the class "reconfigure" is next provided:

```
1  bool reconfigure::match(int Eindex, int Cindex)
2  {
3      openMask.XOR(E->get(Eindex), T->get(Eindex));
4      closedMask.AND(E->get(Eindex), T->get(Eindex));
5      or1.AND(&openMask, C->get(Cindex));
6      not.NOT(C->get(Cindex));
7      or2.AND(&closedMask, ¬);
8      res.OR(&or1, &or2);
9      return res.zero( );
10 }
```

The implementation is straightforward, and is described above with reference to FIG. 11.

An implementation of the function member "check" of the class "reconfigure" is next provided:

```
1  bool reconfigure::check (BoolMatrix* c, BoolMatrix* e,
     BoolMatrix* t)
2  {
3      int tsz;
4
5      if ((c->getSize( ) != e->getSize( )) ||
6          (c->getSize( ) != t->getSize( )) ||
7          (e->getSize( ) != t->getSize( ))) return false;
8      colSize = e->getSize( );
9      if (colSize < 1) return false;
10
11     if ((c->get(0)->getSize( ) != e->get(0)->getSize( )) ||
12         (c->get(0)->getSize( ) != t->get(0)->getSize( )) ||
13         (e->get(0)->getSize( ) != t->get(0)->getSize( ))) return false;
14
15     tsz = e->get(0)->getSize( );
16     if (tsz != rowSize) return false;
17     {
18         openMask.init(tsz);
19         closedMask.init(tsz);
20         or1.init(tsz);
21         or2.init(tsz);
22         not.init(tsz);
23         res.init(tsz);
24         rowSize = tsz;
25     }
26     C = c;
27     E = e;
28     T = t;
29     return true;
30 }
```

The check function carries out various checks on the supplied matrices C, E, and T to determine that they all have the same number of rows, and all rows of the same size. The various intermediate-value instances of the class "BoolArray" are initialized on lines 18-24.

An implementation of the function member "copy" of the class "reconfigure" is provided next.

```
1  bool reconfigure::copy(int& j)
2  {
3
4      bool ret = true;
5
6      for (; j < colSize; j++)
7      {
8          if (!ret) return false;
9          R[S[j].row] = codes.getCurrent( );
10         ret = codes.next( );
11     }
12     return true;
13 }
```

When codes have been successfully associated with all non-zero rows of the sorted defect matrix E, then all remaining codes can be arbitrarily assigned to remaining zero vectors of the sorted defect matrix E. This function simply removes codes sequentially from the available-codes linked list and stores the row indexes into the remapping vector R.

Finally, an implementation of the function member "reconfigurec" of the class "reconfigure" is provided:

```
1  int* reconfigure::reconfigureC (BoolMatrix* c, BoolMatrix* e,
     BoolMatrix* t)
2  {
3      int i, j, k;
4      int Eindex;
5      bool success;
6
7      if (!check(c, e, t)) return null;
8      sortE( );
9
10     for (i = 0; i <= cycle; i++)
11     {
12         success = true;
13         codes.init(C);
14
15         for (j = 0; j < colSize; j++)
16         {
17             codes.first( );
18             if (j == zeros)
19             {
20                 if (!copy(j))
21                     success = false;
22             }
23             else
24             {
25                 if (j >= maxP && j <= minP)
26                     k = (i + j <= minP) ? i + j: i − (cycle − j);
27                 else k = j;
```

```
28          Eindex = S[k].row;
29          while (!match(Eindex, codes.getCurrent( )))
30            if (!codes.next( ))
31            {
32              success = false;
33              break;
34            }
35          if (success)
36          {
37            R[Eindex] = codes.getCurrent( );
38            codes.deleteCurrent( );
39          }
40          else break;
41        }
42      }
43      if (success)
44      {
45        R[colSize] = -1;
46        return &(R[0]);
47      }
48    }
49    return null;
50 }
```

On line 7, the function member "check" is called to check the applied matrices C, E, and T, and carry out initialization of instances of the class "BoolArray." On line 8, the defect matrix E is sorted by constructing the remapping vector S. The reconfiguration process is carried out in three nested loops, including an outer for-loop that begins on line 10, an inner for-loop that begins on line 15, and an inner while-loop within the inner for-loop that begins on line 29. The outer for-loop, that begins on line 10, carries out a separate search for the reconfiguration matrix R using a different starting point within the identical weight, non-zero rows of the defect matrix E defined by the values of the variables "minP" and "maxP." The outer for-loop may be omitted if this more exhaustive search is not desired. In the inner for-loop, that begins on line 15, the linked list of remaining available codes is reset, on line 17, and if all non-zero vectors of the sorted defect vector E have been associated with codes, as determined on line 18, function member "copy" is called on line 20 to associate all remaining zero vectors of the defect matrix E with remaining codes in the linked list. Otherwise, a next row index of the sorted defect matrix E is determined, on line 28, and the remaining codes in the linked list are searched, in the while-loop of lines 29-34 to find a code compatible with the row of the defect matrix E indexed by the index stored in the variable "Eindex." If a compatible code is found, as determined on line 35, an index for the code is stored in the remapping vector R on line 37, and that code is deleted from the linked list on line 38. If the inner for-loop of lines 15-42 successfully completes, as determined on line 43, then the remapping vector is returned on line 46.

Finally, the constructor for the class "reconfigure" is provided:

```
1 reconfigure::reconfigure( )
2 {
3    colSize = 0;
4    rowSize = 0;
5 }
```

Although the present invention has been described in terms of particular embodiments, it is not intended that the invention be limited to these embodiments. Modifications within the spirit of the invention will be apparent to those skilled in the art. For example, as discussed above, there are many possible implementations of the reconfiguration program or routine employed to compute the reconfiguration matrix or, equivalently, the reconfiguration remapping vector R, according to the present invention. As one example, additional levels of additional searching may be implemented to even more exhaustively search the permutation base for the configuration matrix C. The reconfiguration routine may be implemented using different programming languages, may be implemented for execution on any number of different hardware platforms and operating systems or control programs, may vary with variations in familiar programming and implementation parameters, including modular organization, data structures, control structures, and other such parameters. As discussed above, the methods of the present invention can be applied to any type of electronic device, the configuration of which can be expressed in a configuration matrix or, alternatively, a table of internal codes. As discussed above, the implementations discussed in the current application use two defect matrices E and T, both binary, and a single configuration matrix C, also binary. However, to address different types of reconfiguration problems, a single binary defect matrix E may be employed, in the case that only one type of defect needs to be considered, or, alternatively, defect matrices and the configuration matrix may include elements representing values for higher bases computationally represented by two or more consecutive bits in a bit vector, by data units of type "char," or in other ways. As discussed above, permutation of configuration matrix C to generate a reconfiguration matrix may be used exclusively for amelioration of defects, or may be combined with redundancy in components in configuration to provide even greater defect amelioration. While each internal codeword is generally assigned to one addressed signal line, it may be the case that multiple signal lines emanating from a demultiplexer crossbar are addressed by one internal codeword. When a reconfiguration matrix R is computed, it is generally stored in electronic memory to facilitate subsequent device configuration according to the reconfiguration matrix R. In some cases, device configuration may proceed directly, and, in other cases, device reconfiguration may be undertaken at a later time.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A defect-amelioration system comprising:
   a test-out connect for applying signals to a device;
   a test-in connect for receiving signals output by the device; and
   testing logic that
      outputs test signals to the test-out connect and receives signals output by the device in response to the test signals through the test-in connect to test the device in order to identify defects, computes a new configuration for the device from an original configuration and the identified defects so that, when the device is configured according to the new configuration, the device operates correctly despite the identified defects, the testing logic computing the new configuration by:
  considering the rows of configuration matrix C as available codewords;
  sorting the defect matrix rows by the number of defects represented by each row, in descending order, to produce sorted defect matrix rows;
  for each row of the sorted defect matrix rows, starting with a selected sorted defect matrix row,
  searching for a codeword in the available codewords that is compatible with the defect matrix row, and
  when a compatible codeword is found, inserting the codeword into the reconfiguration matrix R at a position corresponding to the position of the defects represented by the defect matrix row and removing the compatible codeword from the available codewords;
wherein the identified defects are represented by one or more defect matrices, and wherein, when more than one defect matrix represents the defects, the rows of the more than one defect matrices are aligned and all rows at a given position within the more than one defect matrices together comprise a defect matrix row;
wherein the original configuration is represented by a configuration matrix having m rows, each row comprising a codeword, each codeword, when expressed as a binary number, having n bits;
wherein the new configuration is represented by a reconfiguration matrix having m rows, each row comprising a codeword, each codeword when expressed as a binary number, having n bits; and
stores the new configuration in memory for subsequent configuration of the device.

2. The defect-amelioration system of claim 1 wherein, when a compatible codeword cannot be found for a defect matrix row, determining that a new configuration cannot be found and storing an indication that the device is defective in memory.

3. The defect-amelioration system of claim 1 wherein, when a compatible codeword cannot be found for a defect matrix row and when there is an additional sorted defect matrix row that can be selected for starting points for searching for compatible codewords, for each row of the sorted defect matrix rows, starting with the additional selected sorted defect matrix row, searching for a codeword in the available codewords that is compatible with the defect matrix row, and when a compatible codeword is found, inserting the codeword into the reconfiguration matrix R at a position corresponding to the position of the defects represented by the defect matrix row and removing the compatible codeword from the available codewords.

4. The defect-amelioration system of claim 1 wherein, when a next considered sorted defect matrix row represents no defects, assigning remaining available codes to unassigned positions in the new configuration matrix R without regard to compatibility.

5. The defect-amelioration system of claim 1
wherein the device includes a demultiplexer having an encoder that receives external addresses and output internal codewords to a crossbar, each internal codeword selecting one or more particular signal lines emanating from the crossbar and deselecting remaining signal lines emanating from the crossbar;
wherein crossbar junctions can be configured into closed states and open states;
wherein the defects comprise crossbar junctions that are permanently open or permanently closed; and
wherein the original configuration and new configuration are represented as configuration matrix C and reconfiguration matrix R, respectively, that both contain internal binary codewords, bit positions within an internal binary codeword corresponding to the configuration state, open or closed, of corresponding crossbar junctions along a signal line emanating from the crossbar at a position within the crossbar corresponding to a position of the internal codeword within the configuration and reconfiguration matrices C and R.

6. The defect-amelioration system of claim 5
wherein a first defect matrix E contains rows, each row corresponding to a different signal line emanating from the crossbar at a position within the crossbar corresponding to a position of the row in the defect matrix E, a binary digit at each position in the row indicating whether or not a crossbar junction, corresponding to the binary digit is defective;
wherein a second defect matrix T contains rows, each row corresponding to a different signal line emanating from the crossbar at a position within the crossbar corresponding to a position of the row in the defect matrix T, a binary digit at each position in a row indicating, for corresponding positions in the defect matrix E with binary digits indicating a defective crossbar junction, whether the defect is an open defect or a closed defect; and
wherein an operation to determine where or not an internal binary codeword $C_x$ is compatible with defects in a row of the crossbar y can be expressed as:
openMask=$E_y$ XOR $T_y$
closedMask=$E_y$ AND $T_y$
compatible=(openMask AND $C_x$) OR (closedMask AND NOT $C_x$).

7. A method for ameliorating defects in a reconfigurable device, the method comprising:
testing the device to identify defects;
using an original configuration for the device and the identified defects, permuting the original configuration to produce a new configuration for the device so that, when the device is configured according to the new configuration, the device will correctly operate despite the identified defects; and
storing the new configuration in an electronic memory to facilitate subsequent configuration of the device according to the new configuration;
wherein the device includes a demultiplexer having an encoder that receives external addresses and outputs internal codewords to a crossbar, each internal codeword selecting one or more particular signal lines emanating from the crossbar and deselecting remaining signal lines emanating from the crossbar;
wherein crossbar junctions can be configured into closed states and open states;
wherein the defects comprise crossbar junctions that are permanently open or permanently closed; and
wherein the original configuration and new configuration are represented as configuration matrix C and reconfiguration matrix R, respectively, that both contain internal binary codewords, bit positions within an internal binary codeword corresponding to the configuration state, open or closed, of corresponding crossbar junctions along a signal line emanating from the crossbar at a position within the crossbar corresponding to a position of the internal codeword within the configuration and reconfiguration matrices C and R.

8. The method of claim 7 wherein the, identified defects are represented by
- a first defect matrix E that contains rows, each row corresponding to a different signal line emanating from the crossbar at a position within the crossbar corresponding to a position of the row in the defect matrix E, a binary digit at each position in the row indicating whether or not a crossbar junction corresponding to the binary digit is defective; and
- a second defect matrix T that contains rows, each row corresponding to a different signal line emanating from the crossbar at a position within the crossbar corresponding to a position of the row in the defect matrix T, a binary digit at each position in a row indicating, for corresponding positions in the defect matrix E with binary digits indicating a defective crossbar junction, whether the defect is an open defect or a closed defect.

9. The method of claim 8 wherein the compatibility of an internal codeword $C_x$ with defects of a signal line y emanating from the crossbar can be determined by openMask=$E_y$ XOR $T_y$
closedMask=$E_y$ AND $T_y$
compatible=openMask AND $C_x$ OR closedMask AND NOT $C_x$.

10. The method of claim 9 wherein using an original configuration for the device and the identified defects, permuting the original configuration to produce a new configuration for the device further comprises:
- considering the rows of configuration matrix C as available codewords;
- sorting the defect matrix rows by the number of defects represented by each row, in descending order, to produce sorted defect matrix rows;
- for each row; of the sorted defect matrix rows, starting with a selected sorted defect matrix row,
  - searching for a codeword in the available codewords that is compatible with the defect matrix row, and
  - when a compatible codeword is found, inserting the codeword into the reconfiguration matrix R at a position corresponding to the position of the defects represented by the defect matrix row and removing the compatible codeword from the available codewords.

11. A method for ameliorating defects in a nanowire crossbar demultiplexer, the method comprising:
- testing the nanowire crossbar demultiplexer to identify defects at nanowire junctions, the nanowire junctions each comprising an intersection between a nanoscale signal line and nanoscale address line, wherein each of the defects comprises a permanently closed or permanently open connection at a junction;
- defining an original configuration matrix comprising a set of codewords for selecting the signal lines when one of the codewords is input on the address lines, each codeword comprising a row in the original configuration matrix;
- determining if one or more of the defects prevents the original configuration matrix from uniquely selecting each of the signal lines, then
- reordering rows in the original configuration matrix to form a reconfiguration matrix that uniquely addresses each of the signal lines using the codewords despite presence of the defects in the nanowire crossbar demultiplexer.

12. The method of claim 11, in which determining if one or more of the defects prevents the original configuration matrix from uniquely selecting each of the signal lines comprises, for each of the signal lines:
- determining if a closed defect along the signal line corresponds to a Boolean digit "0" in an assigned codeword in the original configuration matrix; and
- determining if a open defect along the signal line corresponds to a Boolean digit "1" in an assigned codeword in the original configuration matrix.

13. The method of claim 11, in which reordering rows in the original configuration matrix comprises:
- determining if each of the codewords is compatible with a different signal line despite defects present, such that each signal line can be uniquely address by one of the codewords; and
- reordering the rows of the original configuration matrix so that each codeword is matched with a different signal line.

14. The method of claim 13, in which determining if each of the codewords is compatible with a different signal line comprises:
- determining if a closed defect along the signal line corresponds to a Boolean digit "0" in the codeword;
- determining if an open defect along the signal line corresponds to a Boolean digit "1" in the codeword; and
- if there are no closed defects on a signal line that correspond to a Boolean digit "0" in the codeword and there are no open defects on an signal line corresponds to a Boolean digit "1" in the codeword, then the codeword is compatible with that signal line and is assigned to that signal line in the reconfiguration matrix.

15. The method of claim 13, in which determining if each of the codewords is compatible with a different signal line despite defects present comprises determining compatibility of signal lines with more defective nanowire junctions before signal lines with less defective nanowire junctions by:
- weighting each signal line according to the defects present in junctions along the signal line such that signal lines with more defects are weighted higher than signal lines with less defects;
- comparing codewords from the original configuration matrix against a signal line with a higher weight to determine if one of the codewords is compatible with the signal line with a higher weight.

16. The method of claim 15, further comprising:
- after determining that a codeword is compatible with an signal line with a higher weight,
- comparing a different codeword from the original configuration against an signal line with a lower weight to determine if the codeword is compatible with the signal line with a lower weight.

17. The method of claim 13, in which reordering rows in the original configuration matrix to form a reconfiguration matrix comprises reordering rows of the original configuration matrix such that each of the codewords is assigned to a different compatible signal line.

18. The method of claim 11, in which the reconfiguration matrix specifies both the open/closed configuration for all functional junctions within the nanowire crossbar demultiplexer and codewords for uniquely selecting each of the signal lines.

19. The method of claim 11, further comprising programming the crossbar demultiplexer according to the reconfiguration matrix by selectively applying programming voltages across the nanowire junctions.

20. The method of claim 11, in which the address lines in the nanowire crossbar demultiplexer are non-redundant.

* * * * *